(12) United States Patent
Chung et al.

(10) Patent No.: US 7,494,908 B2
(45) Date of Patent: *Feb. 24, 2009

(54) APPARATUS FOR INTEGRATION OF BARRIER LAYER AND SEED LAYER

(75) Inventors: Hua Chung, San Jose, CA (US); Ling Chen, Sunnyvale, CA (US); Jick Yu, San Jose, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 7 days.

This patent is subject to a terminal disclaimer.

(21) Appl. No.: 11/749,064

(22) Filed: May 15, 2007

(65) Prior Publication Data

US 2007/0283886 A1    Dec. 13, 2007

Related U.S. Application Data

(63) Continuation of application No. 11/064,274, filed on Feb. 22, 2005, now Pat. No. 7,352,048, which is a continuation of application No. 09/965,373, filed on Sep. 26, 2001, now Pat. No. 6,936,906.

(51) Int. Cl.
*H01L 21/3205* (2006.01)
(52) U.S. Cl. .................. 438/597; 438/656; 438/674; 438/685; 438/687; 257/E31.124
(58) Field of Classification Search ............ 438/597, 438/656, 674, 685, 687

See application file for complete search history.

(56) References Cited

U.S. PATENT DOCUMENTS 3,594,216 A    7/1971    Charles et al.
(Continued)

FOREIGN PATENT DOCUMENTS

CN    1 233 856    11/1999
(Continued)

OTHER PUBLICATIONS

Ashtiani, et al. "Pulsed Nucleation Layer of Tungsten Nitride Barrier Film and its Application in DRAM and Logic Manufacturing," Semi Technical Symposium: Innovations in Semiconductor Manufacturing (STS: ISM), Semicon Korea 2006, Semiconductor Equipment and Materials International, pp. 1-6.
(Continued)

*Primary Examiner*—Wai-Sing Louie
(74) *Attorney, Agent, or Firm*—Patterson & Sheridan, LLP

(57) ABSTRACT

A system for processing a substrate is provided which includes at least one atomic layer deposition (ALD) chamber for depositing a barrier layer containing tantalum and at least one physical vapor deposition (PVD) metal seed chamber for depositing a metal seed layer on the barrier layer. The at least one ALD chamber may be in fluid communication with a first precursor source providing a tantalum-containing compound and a second precursor source. In one example, the tantalum-containing compound is an organometallic tantalum precursor, such as PDMAT. In another example, the second precursor source contains a nitrogen precursor, such as ammonia. The PDMAT may have a chlorine concentration of about 100 ppm or less, preferably, about 30 ppm or less, and more preferably, about 5 ppm or less. In some examples, the PVD metal seed chamber is used to deposit a copper-containing metal seed layer.

28 Claims, 6 Drawing Sheets

U.S. PATENT DOCUMENTS

| | | |
|---|---|---|
| 4,058,430 A | 11/1977 | Suntola et al. |
| 4,389,973 A | 6/1983 | Suntola et al. |
| 4,413,022 A | 11/1983 | Suntola et al. |
| 4,415,275 A | 11/1983 | Dietrich |
| 4,486,487 A | 12/1984 | Skarp |
| 4,761,269 A | 8/1988 | Conger et al. |
| 4,767,494 A | 8/1988 | Kobayashi et al. |
| 4,806,321 A | 2/1989 | Nishizawa et al. |
| 4,813,846 A | 3/1989 | Helms |
| 4,829,022 A | 5/1989 | Kobayashi et al. |
| 4,834,831 A | 5/1989 | Nishizawa et al. |
| 4,838,983 A | 6/1989 | Schumaker et al. |
| 4,838,993 A | 6/1989 | Aoki et al. |
| 4,840,921 A | 6/1989 | Matsumoto |
| 4,845,049 A | 7/1989 | Sunakawa |
| 4,859,625 A | 8/1989 | Matsumoto |
| 4,859,627 A | 8/1989 | Sunakawa |
| 4,861,417 A | 8/1989 | Mochizuki et al. |
| 4,876,218 A | 10/1989 | Pessa et al. |
| 4,917,556 A | 4/1990 | Stark et al. |
| 4,927,670 A | 5/1990 | Erbil |
| 4,931,132 A | 6/1990 | Aspnes et al. |
| 4,951,601 A | 8/1990 | Maydan et al. |
| 4,960,720 A | 10/1990 | Shimbo |
| 4,975,252 A | 12/1990 | Nishizawa et al. |
| 4,993,357 A | 2/1991 | Scholz |
| 5,000,113 A | 3/1991 | Wang et al. |
| 5,013,683 A | 5/1991 | Petroff et al. |
| 5,027,746 A | 7/1991 | Frijlink |
| 5,028,565 A | 7/1991 | Chang et al. |
| 5,082,798 A | 1/1992 | Arimoto |
| 5,085,885 A | 2/1992 | Foley et al. |
| 5,091,320 A | 2/1992 | Aspnes et al. |
| 5,130,269 A | 7/1992 | Kitahara et al. |
| 5,166,092 A | 11/1992 | Mochizuki et al. |
| 5,173,327 A | 12/1992 | Sandhu et al. |
| 5,173,474 A | 12/1992 | Connell et al. |
| 5,178,681 A | 1/1993 | Moore et al. |
| 5,186,718 A | 2/1993 | Tepman et al. |
| 5,205,077 A | 4/1993 | Wittstock |
| 5,225,366 A | 7/1993 | Yoder |
| 5,234,561 A | 8/1993 | Randhawa et al. |
| 5,246,536 A | 9/1993 | Nishizawa et al. |
| 5,250,148 A | 10/1993 | Nishizawa et al. |
| 5,254,207 A | 10/1993 | Nishizawa et al. |
| 5,256,244 A | 10/1993 | Ackerman |
| 5,259,881 A | 11/1993 | Edwards et al. |
| 5,261,959 A | 11/1993 | Gasworth |
| 5,270,247 A | 12/1993 | Sakuma et al. |
| 5,278,435 A | 1/1994 | Van Hove et al. |
| 5,281,274 A | 1/1994 | Yoder |
| 5,286,296 A | 2/1994 | Sato et al. |
| 5,290,748 A | 3/1994 | Knuuttila et al. |
| 5,294,286 A | 3/1994 | Nishizawa et al. |
| 5,296,403 A | 3/1994 | Nishizawa et al. |
| 5,300,186 A | 4/1994 | Kitahara et al. |
| 5,306,666 A | 4/1994 | Izumi |
| 5,311,055 A | 5/1994 | Goodman et al. |
| 5,316,615 A | 5/1994 | Copel |
| 5,316,793 A | 5/1994 | Wallace et al. |
| 5,330,610 A | 7/1994 | Eres et al. |
| 5,336,324 A | 8/1994 | Stall et al. |
| 5,338,362 A | 8/1994 | Imahashi |
| 5,338,389 A | 8/1994 | Nishizawa et al. |
| 5,348,911 A | 9/1994 | Jurgensen et al. |
| 5,374,570 A | 12/1994 | Nasu et al. |
| 5,395,791 A | 3/1995 | Cheng et al. |
| 5,438,952 A | 8/1995 | Otsuka |
| 5,439,876 A | 8/1995 | Graf et al. |
| 5,441,703 A | 8/1995 | Jurgensen |
| 5,443,647 A | 8/1995 | Aucoin et al. |
| 5,455,072 A | 10/1995 | Bension et al. |
| 5,458,084 A | 10/1995 | Thorne et al. |
| 5,464,666 A | 11/1995 | Fine et al. |
| 5,469,806 A | 11/1995 | Mochizuki et al. |
| 5,480,818 A | 1/1996 | Matsumoto et al. |
| 5,483,919 A | 1/1996 | Yokoyama et al. |
| 5,484,664 A | 1/1996 | Kitahara et al. |
| 5,503,875 A | 4/1996 | Imai et al. |
| 5,521,126 A | 5/1996 | Okamura et al. |
| 5,526,244 A | 6/1996 | Bishop |
| 5,527,733 A | 6/1996 | Nishizawa et al. |
| 5,532,511 A | 7/1996 | Nishizawa et al. |
| 5,540,783 A | 7/1996 | Eres et al. |
| 5,558,717 A | 9/1996 | Zhao et al. |
| 5,580,380 A | 12/1996 | Liu et al. |
| 5,601,651 A | 2/1997 | Watabe |
| 5,609,689 A | 3/1997 | Kato et al. |
| 5,616,181 A | 4/1997 | Yamamoto et al. |
| 5,637,530 A | 6/1997 | Gaines et al. |
| 5,641,984 A | 6/1997 | Aftergut et al. |
| 5,644,128 A | 7/1997 | Wollnik et al. |
| 5,654,232 A | 8/1997 | Gardner |
| 5,667,592 A | 9/1997 | Boitnott et al. |
| 5,674,786 A | 10/1997 | Turner et al. |
| 5,693,139 A | 12/1997 | Nishizawa et al. |
| 5,695,564 A | 12/1997 | Imahashi |
| 5,705,224 A | 1/1998 | Murota et al. |
| 5,707,880 A | 1/1998 | Aftergut et al. |
| 5,711,811 A | 1/1998 | Suntola et al. |
| 5,730,801 A | 3/1998 | Tepman et al. |
| 5,730,802 A | 3/1998 | Ishizumi et al. |
| 5,744,394 A | 4/1998 | Iguchi et al. |
| 5,747,113 A | 5/1998 | Tsai |
| 5,749,974 A | 5/1998 | Habuka et al. |
| 5,788,447 A | 8/1998 | Yonemitsu et al. |
| 5,788,799 A | 8/1998 | Steger et al. |
| 5,796,116 A | 8/1998 | Nakata et al. |
| 5,801,634 A | 9/1998 | Young et al. |
| 5,804,488 A | 9/1998 | Shih et al. |
| 5,807,792 A | 9/1998 | Ilg et al. |
| 5,830,270 A | 11/1998 | McKee et al. |
| 5,834,372 A | 11/1998 | Lee |
| 5,835,677 A | 11/1998 | Li et al. |
| 5,846,332 A | 12/1998 | Zhao et al. |
| 5,851,849 A | 12/1998 | Comizzoli et al. |
| 5,855,675 A | 1/1999 | Doering et al. |
| 5,855,680 A | 1/1999 | Soininen et al. |
| 5,856,219 A | 1/1999 | Naito et al. |
| 5,858,102 A | 1/1999 | Tsai |
| 5,866,213 A | 2/1999 | Foster et al. |
| 5,866,795 A | 2/1999 | Wang et al. |
| 5,879,459 A | 3/1999 | Gadgil et al. |
| 5,882,165 A | 3/1999 | Maydan et al. |
| 5,882,411 A | 3/1999 | Zhao et al. |
| 5,882,413 A | 3/1999 | Beaulieu et al. |
| 5,904,565 A | 5/1999 | Nguyen et al. |
| 5,906,683 A | 5/1999 | Chen et al. |
| 5,913,147 A | 6/1999 | Dubin et al. |
| 5,916,365 A | 6/1999 | Sherman |
| 5,923,056 A | 7/1999 | Lee et al. |
| 5,923,985 A | 7/1999 | Aoki et al. |
| 5,925,574 A | 7/1999 | Aoki et al. |
| 5,928,389 A | 7/1999 | Jevtic |
| 5,942,040 A | 8/1999 | Kim et al. |
| 5,947,710 A | 9/1999 | Cooper et al. |
| 5,972,430 A | 10/1999 | DiMeo, Jr. et al. |
| 6,001,420 A | 12/1999 | Mosely et al. |
| 6,001,669 A | 12/1999 | Gaines et al. |
| 6,015,590 A | 1/2000 | Suntola et al. |
| 6,015,917 A | 1/2000 | Bhandari et al. |
| 6,025,627 A | 2/2000 | Forbes et al. |
| 6,036,773 A | 3/2000 | Wang et al. |
| 6,037,257 A | 3/2000 | Chiang et al. |

| | | | | | | |
|---|---|---|---|---|---|---|
| 6,042,652 | A | 3/2000 | Hyun et al. | 6,416,822 | B1 | 7/2002 | Chiang et al. |
| 6,043,177 | A | 3/2000 | Falconer et al. | 6,420,189 | B1 | 7/2002 | Lopatin |
| 6,051,286 | A | 4/2000 | Zhao et al. | 6,423,619 | B1 | 7/2002 | Grant et al. |
| 6,062,798 | A | 5/2000 | Muka | 6,428,859 | B1 | 8/2002 | Chiang et al. |
| 6,066,892 | A | 5/2000 | Ding et al. | 6,433,314 | B1 | 8/2002 | Mandrekar et al. |
| 6,071,572 | A | 6/2000 | Mosely et al. | 6,447,607 | B2 | 9/2002 | Soininen et al. |
| 6,071,808 | A | 6/2000 | Merchant et al. | 6,447,933 | B1 | 9/2002 | Wang et al. |
| 6,079,356 | A | 6/2000 | Umotoy et al. | 6,451,119 | B2 | 9/2002 | Sneh et al. |
| 6,084,302 | A | 7/2000 | Sandhu | 6,451,695 | B2 | 9/2002 | Sneh |
| 6,086,677 | A | 7/2000 | Umotoy et al. | 6,454,860 | B2 | 9/2002 | Metzner et al. |
| 6,099,904 | A | 8/2000 | Mak et al. | 6,458,701 | B1 | 10/2002 | Chae et al. |
| 6,110,556 | A | 8/2000 | Bang et al. | 6,464,779 | B1 | 10/2002 | Powell et al. |
| 6,113,977 | A | 9/2000 | Soininen et al. | 6,468,924 | B2 | 10/2002 | Lee et al. |
| 6,117,244 | A | 9/2000 | Bang et al. | 6,475,276 | B1 | 11/2002 | Elers et al. |
| 6,124,158 | A | 9/2000 | Dautartas et al. | 6,475,910 | B1 | 11/2002 | Sneh |
| 6,130,147 | A | 10/2000 | Major et al. | 6,478,872 | B1 | 11/2002 | Chae et al. |
| 6,139,700 | A | 10/2000 | Kang et al. | 6,481,945 | B1 | 11/2002 | Hasper et al. |
| 6,140,238 | A | 10/2000 | Kitch | 6,482,262 | B1 | 11/2002 | Elers et al. |
| 6,143,082 | A | 11/2000 | McInerney et al. | 6,482,733 | B2 | 11/2002 | Raaijmakers et al. |
| 6,143,659 | A | 11/2000 | Leem | 6,482,740 | B2 | 11/2002 | Soininen et al. |
| 6,144,060 | A | 11/2000 | Park et al. | 6,489,214 | B2 | 12/2002 | Kim et al. |
| 6,156,382 | A | 12/2000 | Rajagopalan et al. | 6,498,091 | B1 | 12/2002 | Chen et al. |
| 6,158,446 | A | 12/2000 | Mohindra et al. | 6,511,539 | B1 | 1/2003 | Raaijmakers |
| 6,160,315 | A | 12/2000 | Chiang et al. | 6,520,218 | B1 | 2/2003 | Gregg et al. |
| 6,162,715 | A | 12/2000 | Mak et al. | 6,524,952 | B1 | 2/2003 | Srinivas et al. |
| 6,174,377 | B1 | 1/2001 | Doering et al. | 6,534,395 | B2 | 3/2003 | Werkhoven et al. |
| 6,174,809 | B1 | 1/2001 | Kang et al. | 6,534,404 | B1 | 3/2003 | Danek et al. |
| 6,181,012 | B1 | 1/2001 | Edelstein et al. | 6,548,112 | B1 | 4/2003 | Hillman et al. |
| 6,183,563 | B1 | 2/2001 | Choi et al. | 6,548,424 | B2 | 4/2003 | Putkonen |
| 6,197,683 | B1 | 3/2001 | Kang et al. | 6,551,406 | B2 | 4/2003 | Kilpi |
| 6,200,893 | B1 | 3/2001 | Sneh | 6,551,929 | B1 | 4/2003 | Kori et al. |
| 6,203,613 | B1 | 3/2001 | Gates et al. | 6,558,509 | B2 | 5/2003 | Kraus |
| 6,206,967 | B1 | 3/2001 | Mak et al. | 6,561,498 | B2 | 5/2003 | Tompkins et al. |
| 6,207,302 | B1 | 3/2001 | Sugiura et al. | 6,569,501 | B2 | 5/2003 | Chiang et al. |
| 6,207,487 | B1 | 3/2001 | Kim et al. | 6,572,705 | B1 | 6/2003 | Suntola et al. |
| 6,218,298 | B1 | 4/2001 | Hoinkis | 6,578,287 | B2 | 6/2003 | Aswad |
| 6,231,672 | B1 | 5/2001 | Choi et al. | 6,579,372 | B2 | 6/2003 | Park |
| 6,242,808 | B1 | 6/2001 | Shimizu et al. | 6,585,823 | B1 | 7/2003 | Van Wijck |
| 6,248,605 | B1 | 6/2001 | Harkonen et al. | 6,593,484 | B2 | 7/2003 | Yasuhara et al. |
| 6,249,055 | B1 | 6/2001 | Dubin | 6,596,602 | B2 | 7/2003 | Iizuka et al. |
| 6,251,190 | B1 | 6/2001 | Mak et al. | 6,596,643 | B2 | 7/2003 | Chen et al. |
| 6,251,759 | B1 | 6/2001 | Guo et al. | 6,599,572 | B2 | 7/2003 | Saanila et al. |
| 6,268,291 | B1 | 7/2001 | Andricacos et al. | 6,607,976 | B2 | 8/2003 | Chen et al. |
| 6,270,572 | B1 | 8/2001 | Kim et al. | 6,610,151 | B1 | 8/2003 | Cohen |
| 6,271,148 | B1 | 8/2001 | Kao et al. | 6,620,670 | B2 | 9/2003 | Song et al. |
| 6,271,591 | B1 | 8/2001 | Dubin et al. | 6,620,723 | B1 | 9/2003 | Byun et al. |
| 6,274,484 | B1 | 8/2001 | Tsai et al. | 6,620,956 | B2 | 9/2003 | Chen et al. |
| 6,284,646 | B1 | 9/2001 | Leem | 6,630,030 | B1 | 10/2003 | Suntola et al. |
| 6,287,965 | B1 | 9/2001 | Kang et al. | 6,630,201 | B2 | 10/2003 | Chiang et al. |
| 6,291,876 | B1 | 9/2001 | Stumborg et al. | 6,632,279 | B1 | 10/2003 | Ritala et al. |
| 6,302,965 | B1 | 10/2001 | Umotoy et al. | 6,635,965 | B1 | 10/2003 | Lee et al. |
| 6,305,314 | B1 | 10/2001 | Sneh et al. | 6,660,126 | B2 | 12/2003 | Nguyen et al. |
| 6,306,216 | B1 | 10/2001 | Kim et al. | 6,660,622 | B2 | 12/2003 | Chen et al. |
| 6,309,713 | B1 | 10/2001 | Mak et al. | 6,660,660 | B2 | 12/2003 | Haukka et al. |
| 6,316,098 | B1 | 11/2001 | Yitzchaik et al. | 6,686,271 | B2 | 2/2004 | Raaijmakers et al. |
| 6,326,297 | B1 | 12/2001 | Vijayendran | 6,716,287 | B1 | 4/2004 | Santiago et al. |
| 6,333,260 | B1 | 12/2001 | Kwon et al. | 6,718,126 | B2 | 4/2004 | Lei |
| 6,335,240 | B1 | 1/2002 | Kim et al. | 6,720,027 | B2 | 4/2004 | Yang et al. |
| 6,335,280 | B1 | 1/2002 | van der Jeugd | 6,734,020 | B2 | 5/2004 | Lu et al. |
| 6,342,277 | B1 | 1/2002 | Sherman | 6,740,585 | B2 | 5/2004 | Yoon et al. |
| 6,348,376 | B2 | 2/2002 | Lim et al. | 6,772,072 | B2 | 8/2004 | Ganguli et al. |
| 6,355,561 | B1 | 3/2002 | Sandhu et al. | 6,773,507 | B2 | 8/2004 | Jallepally et al. |
| 6,358,829 | B2 | 3/2002 | Yoon et al. | 6,777,352 | B2 | 8/2004 | Tepman et al. |
| 6,368,954 | B1 | 4/2002 | Lopatin et al. | 6,778,762 | B1 | 8/2004 | Shareef et al. |
| 6,369,430 | B1 | 4/2002 | Adetutu et al. | 6,784,096 | B2 | 8/2004 | Chen et al. |
| 6,372,598 | B2 | 4/2002 | Kang et al. | 6,790,773 | B1 | 9/2004 | Drewery et al. |
| 6,379,748 | B1 | 4/2002 | Bhandari et al. | 6,797,108 | B2 | 9/2004 | Wendling |
| 6,387,806 | B1 | 5/2002 | Wang et al. | 6,797,340 | B2 | 9/2004 | Fang et al. |
| 6,391,163 | B1 | 5/2002 | Pavate et al. | 6,800,173 | B2 | 10/2004 | Chiang et al. |
| 6,391,785 | B1 | 5/2002 | Satta et al. | 6,803,272 | B1 | 10/2004 | Halliyal et al. |
| 6,399,491 | B2 | 6/2002 | Jeon et al. | 6,809,026 | B2 | 10/2004 | Yoon et al. |
| 6,399,496 | B1 | 6/2002 | Edelstein et al. | 6,814,087 | B2 | 11/2004 | Chandran et al. |
| 6,416,577 | B1 | 7/2002 | Suntola et al. | 6,815,285 | B2 | 11/2004 | Choi et al. |

| | | | | | |
|---|---|---|---|---|---|
| 6,818,094 B2 | 11/2004 | Yudovsky | 2001/0034123 A1 | 10/2001 | Jeon et al. |
| 6,821,563 B2 | 11/2004 | Yudovsky | 2001/0041250 A1 | 11/2001 | Werkhoven |
| 6,827,815 B2 | 12/2004 | Hytros et al. | 2001/0042523 A1 | 11/2001 | Kasala |
| 6,827,978 B2 | 12/2004 | Yoon et al. | 2001/0042799 A1 | 11/2001 | Kim et al. |
| 6,831,004 B2 | 12/2004 | Byun et al. | 2001/0050039 A1 | 12/2001 | Park |
| 6,833,161 B2 | 12/2004 | Wang et al. | 2001/0054377 A1 | 12/2001 | Lindfors et al. |
| 6,838,125 B2 | 1/2005 | Chung et al. | 2001/0054730 A1 | 12/2001 | Kim et al. |
| 6,841,200 B2 | 1/2005 | Kraus et al. | 2001/0054769 A1 | 12/2001 | Raaijmakers et al. |
| 6,846,516 B2 | 1/2005 | Yang et al. | 2002/0000196 A1 | 1/2002 | Park |
| 6,849,545 B2 | 2/2005 | Mak et al. | 2002/0000598 A1 | 1/2002 | Kang et al. |
| 6,855,368 B1 | 2/2005 | Kori et al. | 2002/0004293 A1 | 1/2002 | Soininen et al. |
| 6,866,746 B2 | 3/2005 | Lei et al. | 2002/0005168 A1 | 1/2002 | Kraus et al. |
| 6,868,859 B2 | 3/2005 | Yudovsky | 2002/0007790 A1 | 1/2002 | Park |
| 6,875,271 B2 | 4/2005 | Glenn et al. | 2002/0009544 A1 | 1/2002 | McFeely et al. |
| 6,878,206 B2 | 4/2005 | Tzu et al. | 2002/0009896 A1 | 1/2002 | Sandhu et al. |
| 6,881,437 B2 | 4/2005 | Ivanov et al. | 2002/0017242 A1 | 2/2002 | Hamaguchi et al. |
| 6,893,915 B2 | 5/2005 | Park et al. | 2002/0019121 A1 | 2/2002 | Pyo |
| 6,902,624 B2 | 6/2005 | Seidel et al. | 2002/0020869 A1 | 2/2002 | Park et al. |
| 6,905,541 B2 | 6/2005 | Chen et al. | 2002/0021544 A1 | 2/2002 | Cho et al. |
| 6,905,737 B2 | 6/2005 | Verplancken et al. | 2002/0031618 A1 | 3/2002 | Sherman |
| 6,911,093 B2 | 6/2005 | Stacey et al. | 2002/0037630 A1 | 3/2002 | Agarwal et al. |
| 6,911,391 B2 | 6/2005 | Yang et al. | 2002/0041931 A1 | 4/2002 | Suntola et al. |
| 6,915,592 B2 | 7/2005 | Guenther | 2002/0048635 A1 | 4/2002 | Kim et al. |
| 6,916,398 B2 | 7/2005 | Chen et al. | 2002/0048880 A1 | 4/2002 | Lee |
| 6,921,062 B2 | 7/2005 | Gregg et al. | 2002/0052097 A1 | 5/2002 | Park |
| 6,932,871 B2 | 8/2005 | Chang et al. | 2002/0055235 A1 | 5/2002 | Agarwal et al. |
| 6,936,538 B2 | 8/2005 | Byun | 2002/0060363 A1 | 5/2002 | Xi et al. |
| 6,936,906 B2 * | 8/2005 | Chung et al. ............. 257/486 | 2002/0061612 A1 | 5/2002 | Sandhu et al. |
| 6,939,804 B2 | 9/2005 | Lai et al. | 2002/0066411 A1 | 6/2002 | Chiang et al. |
| 6,946,033 B2 | 9/2005 | Tsuei et al. | 2002/0068458 A1 | 6/2002 | Chiang et al. |
| 6,951,804 B2 | 10/2005 | Seutter et al. | 2002/0073924 A1 | 6/2002 | Chiang et al. |
| 6,953,742 B2 | 10/2005 | Chen et al. | 2002/0074588 A1 | 6/2002 | Lee et al. |
| 6,955,211 B2 | 10/2005 | Ku et al. | 2002/0076481 A1 | 6/2002 | Chiang et al. |
| 6,958,174 B1 | 10/2005 | Klaus et al. | 2002/0076507 A1 | 6/2002 | Chiang et al. |
| 6,958,296 B2 | 10/2005 | Chen et al. | 2002/0076508 A1 | 6/2002 | Chiang et al. |
| 6,983,892 B2 | 1/2006 | Noorbakhsh et al. | 2002/0076837 A1 | 6/2002 | Hujanen et al. |
| 6,994,319 B2 | 2/2006 | Yudovsky | 2002/0081844 A1 | 6/2002 | Jeon et al. |
| 6,998,014 B2 | 2/2006 | Chen et al. | 2002/0086106 A1 | 7/2002 | Park et al. |
| 7,005,372 B2 | 2/2006 | Levy et al. | 2002/0086111 A1 | 7/2002 | Byun et al. |
| 7,026,238 B2 | 4/2006 | Xi et al. | 2002/0086507 A1 | 7/2002 | Park et al. |
| 7,033,922 B2 | 4/2006 | Kori et al. | 2002/0090829 A1 | 7/2002 | Sandhu et al. |
| 7,041,335 B2 | 5/2006 | Chung | 2002/0092471 A1 | 7/2002 | Kang et al. |
| 7,049,226 B2 | 5/2006 | Chung et al. | 2002/0092584 A1 | 7/2002 | Soininen et al. |
| 7,066,194 B2 | 6/2006 | Ku et al. | 2002/0094689 A1 | 7/2002 | Park |
| 7,085,616 B2 | 8/2006 | Chin et al. | 2002/0098627 A1 | 7/2002 | Pomarede et al. |
| 7,094,680 B2 | 8/2006 | Seutter et al. | 2002/0098685 A1 | 7/2002 | Sophie et al. |
| 7,094,685 B2 | 8/2006 | Yang et al. | 2002/0104481 A1 | 8/2002 | Chiang et al. |
| 7,101,795 B1 | 9/2006 | Xi et al. | 2002/0105088 A1 | 8/2002 | Yang et al. |
| 7,115,494 B2 | 10/2006 | Sinha et al. | 2002/0106451 A1 | 8/2002 | Skarp et al. |
| 7,115,499 B2 | 10/2006 | Wang et al. | 2002/0106536 A1 | 8/2002 | Lee et al. |
| 7,141,494 B2 | 11/2006 | Lee et al. | 2002/0106846 A1 | 8/2002 | Seutter et al. |
| 7,175,713 B2 | 2/2007 | Thakur et al. | 2002/0108570 A1 | 8/2002 | Lindfors |
| 7,186,385 B2 | 3/2007 | Ganguli et al. | 2002/0109168 A1 | 8/2002 | Kim et al. |
| 7,201,803 B2 | 4/2007 | Lu et al. | 2002/0110991 A1 | 8/2002 | Li |
| 7,204,886 B2 | 4/2007 | Chen et al. | 2002/0115252 A1 | 8/2002 | Haukka et al. |
| 7,208,413 B2 | 4/2007 | Byun et al. | 2002/0115886 A1 | 8/2002 | Yasuhara et al. |
| 7,211,144 B2 | 5/2007 | Lu et al. | 2002/0117399 A1 | 8/2002 | Chen et al. |
| 7,211,508 B2 | 5/2007 | Chung et al. | 2002/0121241 A1 | 9/2002 | Nguyen et al. |
| 7,220,673 B2 | 5/2007 | Xi et al. | 2002/0121342 A1 | 9/2002 | Nguyen et al. |
| 7,222,636 B2 | 5/2007 | Nguyen et al. | 2002/0121697 A1 | 9/2002 | Marsh |
| 7,228,873 B2 | 6/2007 | Ku et al. | 2002/0122884 A1 | 9/2002 | Chen et al. |
| 2001/0000866 A1 | 5/2001 | Sneh et al. | 2002/0127336 A1 | 9/2002 | Chen et al. |
| 2001/0002280 A1 | 5/2001 | Sneh | 2002/0127745 A1 | 9/2002 | Lu et al. |
| 2001/0009140 A1 | 7/2001 | Bondestam et al. | 2002/0134307 A1 | 9/2002 | Choi |
| 2001/0009695 A1 | 7/2001 | Saanila et al. | 2002/0135071 A1 | 9/2002 | Kang et al. |
| 2001/0011526 A1 | 8/2001 | Doering et al. | 2002/0144655 A1 | 10/2002 | Chiang et al. |
| 2001/0013312 A1 | 8/2001 | Soininen et al. | 2002/0144657 A1 | 10/2002 | Chiang et al. |
| 2001/0014371 A1 | 8/2001 | Kilpi | 2002/0145210 A1 | 10/2002 | Tompkins et al. |
| 2001/0024387 A1 | 9/2001 | Raaijmakers et al. | 2002/0146511 A1 | 10/2002 | Chiang et al. |
| 2001/0025979 A1 | 10/2001 | Kim et al. | 2002/0155722 A1 | 10/2002 | Satta et al. |
| 2001/0028924 A1 | 10/2001 | Sherman | 2002/0162506 A1 | 11/2002 | Sneh et al. |
| 2001/0029094 A1 | 10/2001 | Mee-Young et al. | 2002/0164421 A1 | 11/2002 | Chiang et al. |
| 2001/0031562 A1 | 10/2001 | Raaijmakers et al. | 2002/0164423 A1 | 11/2002 | Chiang et al. |

| | | | | | |
|---|---|---|---|---|---|
| 2002/0173130 A1 | 11/2002 | Pomerede et al. | 2003/0168750 A1 | 9/2003 | Basceri et al. |
| 2002/0177282 A1 | 11/2002 | Song et al. | 2003/0172872 A1 | 9/2003 | Thakur et al. |
| 2002/0182320 A1 | 12/2002 | Leskela et al. | 2003/0173586 A1 | 9/2003 | Moriwaki et al. |
| 2002/0187256 A1 | 12/2002 | Elers et al. | 2003/0181035 A1 | 9/2003 | Yoon |
| 2002/0187631 A1 | 12/2002 | Kim et al. | 2003/0185980 A1 | 10/2003 | Endo |
| 2002/0196591 A1 | 12/2002 | Hujanen et al. | 2003/0186495 A1 | 10/2003 | Saanila et al. |
| 2002/0197402 A1 | 12/2002 | Chiang et al. | 2003/0190423 A1 | 10/2003 | Yang et al. |
| 2002/0197863 A1 | 12/2002 | Mak et al. | 2003/0190497 A1 | 10/2003 | Yang et al. |
| 2002/0197881 A1 | 12/2002 | Ramdani et al. | 2003/0190804 A1 | 10/2003 | Glenn et al. |
| 2003/0004723 A1 | 1/2003 | Chihara | 2003/0194493 A1 | 10/2003 | Chang et al. |
| 2003/0010451 A1 | 1/2003 | Tzu et al. | 2003/0194825 A1 | 10/2003 | Law et al. |
| 2003/0013300 A1 | 1/2003 | Byun | 2003/0198740 A1 | 10/2003 | Wendling |
| 2003/0013320 A1 | 1/2003 | Kim et al. | 2003/0198754 A1 | 10/2003 | Xi et al. |
| 2003/0015764 A1 | 1/2003 | Raaijmakers et al. | 2003/0203616 A1 | 10/2003 | Chung et al. |
| 2003/0017697 A1 | 1/2003 | Choi et al. | 2003/0205729 A1 | 11/2003 | Basceri et al. |
| 2003/0022338 A1 | 1/2003 | Ruben et al. | 2003/0213560 A1 | 11/2003 | Wang et al. |
| 2003/0022487 A1 | 1/2003 | Yoon et al. | 2003/0213987 A1 | 11/2003 | Basceri et al. |
| 2003/0022507 A1 | 1/2003 | Chen et al. | 2003/0216981 A1 | 11/2003 | Tillman |
| 2003/0029715 A1 | 2/2003 | Yu et al. | 2003/0219942 A1 | 11/2003 | Choi et al. |
| 2003/0031807 A1 | 2/2003 | Elers et al. | 2003/0221780 A1 | 12/2003 | Lei et al. |
| 2003/0032281 A1 | 2/2003 | Werkhoven et al. | 2003/0224107 A1 | 12/2003 | Lindfors et al. |
| 2003/0038369 A1 | 2/2003 | Layadi et al. | 2003/0224217 A1 | 12/2003 | Byun et al. |
| 2003/0042630 A1 | 3/2003 | Babcoke et al. | 2003/0224578 A1 | 12/2003 | Chung et al. |
| 2003/0049931 A1 | 3/2003 | Byun et al. | 2003/0224600 A1 | 12/2003 | Cao et al. |
| 2003/0049942 A1 | 3/2003 | Haukka et al. | 2003/0232497 A1 | 12/2003 | Xi et al. |
| 2003/0053799 A1 | 3/2003 | Lei | 2003/0232554 A1 | 12/2003 | Blum et al. |
| 2003/0054631 A1 | 3/2003 | Raaijmakers et al. | 2003/0235961 A1 | 12/2003 | Metzner et al. |
| 2003/0057526 A1 | 3/2003 | Chung et al. | 2004/0005749 A1 | 1/2004 | Choi et al. |
| 2003/0057527 A1 | 3/2003 | Chung et al. | 2004/0009307 A1 | 1/2004 | Koh et al. |
| 2003/0059538 A1 | 3/2003 | Chung et al. | 2004/0009336 A1 | 1/2004 | Marcada et al. |
| 2003/0072884 A1 | 4/2003 | Zhang et al. | 2004/0011404 A1 | 1/2004 | Ku et al. |
| 2003/0072913 A1 | 4/2003 | Chou et al. | 2004/0011504 A1 | 1/2004 | Ku et al. |
| 2003/0072975 A1 | 4/2003 | Shero et al. | 2004/0013577 A1 | 1/2004 | Ganguli et al. |
| 2003/0075273 A1 | 4/2003 | Kilpela et al. | 2004/0013803 A1 | 1/2004 | Chung et al. |
| 2003/0075925 A1 | 4/2003 | Lindfors et al. | 2004/0014315 A1 | 1/2004 | Lai et al. |
| 2003/0079686 A1 | 5/2003 | Chen et al. | 2004/0014320 A1 | 1/2004 | Chen et al. |
| 2003/0082296 A1 | 5/2003 | Elers et al. | 2004/0015300 A1 | 1/2004 | Ganguli et al. |
| 2003/0082300 A1 | 5/2003 | Todd et al. | 2004/0016404 A1 | 1/2004 | Gregg et al. |
| 2003/0082301 A1 | 5/2003 | Chen et al. | 2004/0016866 A1 | 1/2004 | Huang et al. |
| 2003/0082307 A1 | 5/2003 | Chung et al. | 2004/0018304 A1 | 1/2004 | Chung et al. |
| 2003/0087520 A1 | 5/2003 | Chen et al. | 2004/0018723 A1 | 1/2004 | Byun et al. |
| 2003/0089308 A1 | 5/2003 | Raajimakers | 2004/0018747 A1 | 1/2004 | Lee et al. |
| 2003/0089942 A1 | 5/2003 | Bhattacharyya et al. | 2004/0025370 A1 | 2/2004 | Guenther |
| 2003/0096468 A1 | 5/2003 | Soininen et al. | 2004/0028952 A1 | 2/2004 | Cartier et al. |
| 2003/0097013 A1 | 5/2003 | Chen et al. | 2004/0033698 A1 | 2/2004 | Lee et al. |
| 2003/0101927 A1 | 6/2003 | Raaijmakers et al. | 2004/0041320 A1 | 3/2004 | Hodumi |
| 2003/0101938 A1 | 6/2003 | Ronsse et al. | 2004/0043630 A1 | 3/2004 | Vaarstra et al. |
| 2003/0104126 A1 | 6/2003 | Fang et al. | 2004/0046197 A1 | 3/2004 | Basceri et al. |
| 2003/0106490 A1 | 6/2003 | Jallepally et al. | 2004/0048491 A1 | 3/2004 | Jung et al. |
| 2003/0108674 A1 | 6/2003 | Chung et al. | 2004/0051152 A1 | 3/2004 | Nakajima |
| 2003/0113187 A1 | 6/2003 | Lei et al. | 2004/0053484 A1 | 3/2004 | Kumar et al. |
| 2003/0116087 A1 | 6/2003 | Nguyen et al. | 2004/0065255 A1 | 4/2004 | Yang et al. |
| 2003/0116804 A1 | 6/2003 | Visokay et al. | 2004/0067641 A1 | 4/2004 | Yudovsky |
| 2003/0121469 A1 | 7/2003 | Lindfors et al. | 2004/0069227 A1 | 4/2004 | Ku et al. |
| 2003/0121608 A1 | 7/2003 | Chen et al. | 2004/0071897 A1 | 4/2004 | Verplancken et al. |
| 2003/0123216 A1 | 7/2003 | Yoon et al. | 2004/0077183 A1 | 4/2004 | Chung |
| 2003/0124262 A1 | 7/2003 | Chen et al. | 2004/0105934 A1 | 6/2004 | Chang et al. |
| 2003/0127043 A1 | 7/2003 | Lu et al. | 2004/0143370 A1 | 7/2004 | Lu et al. |
| 2003/0129308 A1 | 7/2003 | Chen et al. | 2004/0144308 A1 | 7/2004 | Yudovsky |
| 2003/0129826 A1 | 7/2003 | Werkhoven et al. | 2004/0144309 A1 | 7/2004 | Yudovsky |
| 2003/0134508 A1 | 7/2003 | Raaijmakers et al. | 2004/0144311 A1 | 7/2004 | Chen et al. |
| 2003/0140854 A1 | 7/2003 | Kilpi | 2004/0144431 A1 | 7/2004 | Chen et al. |
| 2003/0143328 A1 | 7/2003 | Chen et al. | 2004/0170403 A1 | 9/2004 | Lei |
| 2003/0143747 A1 | 7/2003 | Bondestam et al. | 2004/0187304 A1 | 9/2004 | Chen et al. |
| 2003/0143839 A1 | 7/2003 | Raaijmakers et al. | 2004/0197492 A1 | 10/2004 | Chen et al. |
| 2003/0143841 A1 | 7/2003 | Yang et al. | 2004/0202786 A1 | 10/2004 | Wongsenakhum |
| 2003/0153177 A1 | 8/2003 | Tepman et al. | 2004/0203254 A1 | 10/2004 | Conley, Jr. et al. |
| 2003/0153181 A1 | 8/2003 | Yoon et al. | 2004/0209460 A1 | 10/2004 | Xi et al. |
| 2003/0157760 A1 | 8/2003 | Xi et al. | 2004/0209465 A1 | 10/2004 | Xi et al. |
| 2003/0160277 A1 | 8/2003 | Bhattacharyya | 2004/0211665 A1 | 10/2004 | Yoon et al. |
| 2003/0161952 A1 | 8/2003 | Wang et al. | 2004/0214354 A1 | 10/2004 | Conley, Jr. et al. |
| 2003/0165615 A1 | 9/2003 | Aaltonen et al. | 2004/0219784 A1 | 11/2004 | Kang et al. |
| 2003/0167612 A1 | 9/2003 | Kraus et al. | 2004/0224506 A1 | 11/2004 | Choi et al. |

| | | |
|---|---|---|
| 2004/0235285 A1 | 11/2004 | Kang et al. |
| 2004/0241321 A1 | 12/2004 | Ganguli et al. |
| 2004/0247788 A1 | 12/2004 | Fang et al. |
| 2004/0253375 A1 | 12/2004 | Ivanov et al. |
| 2004/0256351 A1 | 12/2004 | Chung et al. |
| 2005/0006799 A1 | 1/2005 | Gregg et al. |
| 2005/0008779 A1 | 1/2005 | Yang et al. |
| 2005/0009325 A1 | 1/2005 | Chung et al. |
| 2005/0031786 A1 | 2/2005 | Lee et al. |
| 2005/0059240 A1 | 3/2005 | Choi et al. |
| 2005/0059241 A1 | 3/2005 | Kori et al. |
| 2005/0064207 A1 | 3/2005 | Senzaki et al. |
| 2005/0070126 A1 | 3/2005 | Senzaki |
| 2005/0074968 A1 | 4/2005 | Chen et al. |
| 2005/0095859 A1 | 5/2005 | Chen et al. |
| 2005/0104142 A1 | 5/2005 | Narayanan et al. |
| 2005/0106865 A1 | 5/2005 | Chung et al. |
| 2005/0115675 A1 | 6/2005 | Tzu et al. |
| 2005/0118804 A1 | 6/2005 | Byun et al. |
| 2005/0139160 A1 | 6/2005 | Lei et al. |
| 2005/0139948 A1 | 6/2005 | Chung et al. |
| 2005/0153571 A1 | 7/2005 | Senzaki |
| 2005/0164487 A1 | 7/2005 | Seutter et al. |
| 2005/0173068 A1 | 8/2005 | Chen et al. |
| 2005/0176240 A1 | 8/2005 | Wang et al. |
| 2005/0189072 A1 | 9/2005 | Chen et al. |
| 2005/0208763 A1 | 9/2005 | Byun et al. |
| 2005/0220998 A1 | 10/2005 | Chang et al. |
| 2005/0229969 A1 | 10/2005 | Nuyen et al. |
| 2005/0233156 A1 | 10/2005 | Senzaki et al. |
| 2005/0252449 A1 | 11/2005 | Nguyen et al. |
| 2005/0255243 A1 | 11/2005 | Senzaki |
| 2005/0255690 A1 | 11/2005 | Chen et al. |
| 2005/0257735 A1 | 11/2005 | Guenther et al. |
| 2005/0260357 A1 | 11/2005 | Olsen et al. |
| 2005/0271812 A1 | 12/2005 | Myo et al. |
| 2005/0271813 A1 | 12/2005 | Kher et al. |
| 2005/0271814 A1 | 12/2005 | Chang et al. |
| 2005/0277290 A1 | 12/2005 | Yang et al. |
| 2005/0287807 A1 | 12/2005 | Lai et al. |
| 2006/0009034 A1 | 1/2006 | Lai et al. |
| 2006/0018639 A1 | 1/2006 | Ramamurthy et al. |
| 2006/0019033 A1 | 1/2006 | Muthukrishman et al. |
| 2006/0030148 A1 | 2/2006 | Seutter et al. |
| 2006/0035025 A1 | 2/2006 | Verplancken et al. |
| 2006/0040052 A1 | 2/2006 | Feng et al. |
| 2006/0062917 A1 | 3/2006 | Muthukrishman et al. |
| 2006/0075966 A1 | 4/2006 | Chen et al. |
| 2006/0128132 A1 | 6/2006 | Sinha et al. |
| 2006/0128150 A1 | 6/2006 | Gandikota et al. |
| 2006/0148253 A1 | 7/2006 | Chung et al. |
| 2006/0153973 A1 | 7/2006 | Chang et al. |
| 2006/0153995 A1 | 7/2006 | Narwanker et al. |
| 2006/0156979 A1 | 7/2006 | Thakur et al. |
| 2006/0199372 A1 | 9/2006 | Chung et al. |
| 2006/0213557 A1 | 9/2006 | Ku et al. |
| 2006/0213558 A1 | 9/2006 | Ku et al. |
| 2006/0216928 A1 | 9/2006 | Chung et al. |
| 2006/0223286 A1 | 10/2006 | Chin et al. |
| 2006/0257295 A1 | 11/2006 | Chen et al. |
| 2006/0264031 A1 | 11/2006 | Xi et al. |
| 2006/0276020 A1 | 12/2006 | Yoon et al. |
| 2006/0292864 A1 | 12/2006 | Yang et al. |
| 2006/0292874 A1 | 12/2006 | Kori et al. |
| 2007/0003698 A1 | 1/2007 | Chen et al. |
| 2007/0009658 A1 | 1/2007 | Yoo et al. |
| 2007/0020890 A1 | 1/2007 | Thakur et al. |
| 2007/0020924 A1 | 1/2007 | Wang et al. |
| 2007/0026147 A1 | 2/2007 | Chen et al. |
| 2007/0067609 A1 | 3/2007 | Chen et al. |
| 2007/0079759 A1 | 4/2007 | Lee et al. |
| 2007/0095285 A1 | 5/2007 | Thakur et al. |
| 2007/0099415 A1 | 5/2007 | Chen et al. |
| 2007/0119370 A1 | 5/2007 | Ma et al. |
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |

FOREIGN PATENT DOCUMENTS

| | | |
|---|---|---|
| DE | 196 27 017 | 1/1997 |
| DE | 198 20 147 | 7/1999 |
| EP | 0 344 352 A1 | 6/1988 |
| EP | 0 442 290 A1 | 2/1991 |
| EP | 0 429 270 A2 | 5/1991 |
| EP | 0 497 267 | 1/1992 |
| EP | 0 799 641 A2 | 10/1997 |
| EP | 0 954 027 | 11/1999 |
| EP | 1 142 894 A2 | 10/2001 |
| EP | 1 167 569 | 1/2002 |
| FR | 2 626 110 | 7/1989 |
| FR | 2 692 597 | 12/1993 |
| GB | 2 355 727 | 5/2001 |
| JP | 58-098917 | 6/1983 |
| JP | 58-100419 | 6/1983 |
| JP | 60-065712 A | 4/1985 |
| JP | 61-035847 | 2/1986 |
| JP | 61-210623 | 9/1986 |
| JP | 62-069508 | 3/1987 |
| JP | 62-091495 A | 4/1987 |
| JP | 62-141717 | 6/1987 |
| JP | 62-167297 | 7/1987 |
| JP | 62-171999 | 7/1987 |
| JP | 62-232919 | 10/1987 |
| JP | 63-062313 | 3/1988 |
| JP | 63-085098 | 4/1988 |
| JP | 63-090833 | 4/1988 |
| JP | 63-222420 | 9/1988 |
| JP | 63-222421 | 9/1988 |
| JP | 63-227007 | 9/1988 |
| JP | 63-252420 | 10/1988 |
| JP | 63-266814 | 11/1988 |
| JP | 64-009895 | 1/1989 |
| JP | 64-009896 | 1/1989 |
| JP | 64-009897 | 1/1989 |
| JP | 64-037832 | 2/1989 |
| JP | 64-082615 | 3/1989 |
| JP | 64-082617 | 3/1989 |
| JP | 64-082671 | 3/1989 |
| JP | 64-082676 | 3/1989 |
| JP | 01-103982 | 4/1989 |
| JP | 01-103996 | 4/1989 |
| JP | 64-090524 | 4/1989 |
| JP | 01-117017 | 5/1989 |
| JP | 01-143221 | 6/1989 |
| JP | 01-143233 | 6/1989 |
| JP | 01-154511 | 6/1989 |
| JP | 01-236657 | 9/1989 |
| JP | 01-245512 | 9/1989 |
| JP | 01-264218 | 10/1989 |
| JP | 01-270593 | 10/1989 |
| JP | 01-272108 | 10/1989 |
| JP | 01-290221 | 11/1989 |
| JP | 01-290222 | 11/1989 |
| JP | 01-296673 | 11/1989 |
| JP | 01-303770 | 12/1989 |
| JP | 01-305894 | 12/1989 |
| JP | 01-313927 | 12/1989 |
| JP | 02-012814 | 1/1990 |
| JP | 02-014513 | 1/1990 |
| JP | 02-017634 | 1/1990 |
| JP | 02-063115 | 3/1990 |
| JP | 02-074029 | 3/1990 |
| JP | 02-074587 | 3/1990 |
| JP | 02-106822 | 4/1990 |

| | | | | | |
|---|---|---|---|---|---|
| JP | 02-129913 | 5/1990 | JP | 05-047666 | 2/1996 |
| JP | 02-162717 | 6/1990 | JP | 08-181076 | 7/1996 |
| JP | 02-172895 | 7/1990 | JP | 08-245291 | 9/1996 |
| JP | 02-196092 | 8/1990 | JP | 08-264530 | 10/1996 |
| JP | 02-203517 | 8/1990 | JP | 09-260786 | 10/1997 |
| JP | 02-230690 | 9/1990 | JP | 09-293681 | 11/1997 |
| JP | 02-230722 | 9/1990 | JP | 10-188840 | 7/1998 |
| JP | 02-246161 | 9/1990 | JP | 10-190128 | 7/1998 |
| JP | 02-264491 | 10/1990 | JP | 10-308283 | 11/1998 |
| JP | 02-283084 | 11/1990 | JP | 11-269652 | 10/1999 |
| JP | 02-304916 | 12/1990 | JP | 2000-031387 | 1/2000 |
| JP | 03-019211 | 1/1991 | JP | 2000-058777 | 2/2000 |
| JP | 03-022569 | 1/1991 | JP | 2000-068072 | 3/2000 |
| JP | 03-023294 | 1/1991 | JP | 2000-087029 | 3/2000 |
| JP | 03-023299 | 1/1991 | JP | 2000-319772 | 3/2000 |
| JP | 03-044967 | 2/1991 | JP | 2000-138094 | 5/2000 |
| JP | 03-048421 | 3/1991 | JP | 2000-178735 | 6/2000 |
| JP | 03-070124 | 3/1991 | JP | 2000-218445 | 8/2000 |
| JP | 03-185716 | 8/1991 | JP | 2001-020075 | 11/2000 |
| JP | 03-208885 | 9/1991 | JP | 2000-340883 | 12/2000 |
| JP | 03-234025 | 10/1991 | JP | 2000-353666 | 12/2000 |
| JP | 03-286522 | 12/1991 | JP | 2001-62244 | 3/2001 |
| JP | 03-286531 | 12/1991 | JP | 2001-111000 | 4/2001 |
| JP | 04-031391 | 2/1992 | JP | 2001-152339 | 6/2001 |
| JP | 04-031396 A | 2/1992 | JP | 2001-172767 | 6/2001 |
| JP | 04-100292 | 4/1992 | JP | 2001-189312 | 7/2001 |
| JP | 04-111418 | 4/1992 | JP | 2001-217206 | 8/2001 |
| JP | 04-132214 | 5/1992 | JP | 2001-220287 | 8/2001 |
| JP | 04-132681 | 5/1992 | JP | 2001-220294 | 8/2001 |
| JP | 04-151822 | 5/1992 | JP | 2001-240972 | 9/2001 |
| JP | 04-162418 | 6/1992 | JP | 2001-254181 | 9/2001 |
| JP | 04-175299 | 6/1992 | JP | 2001-284042 | 10/2001 |
| JP | 04-186824 | 7/1992 | JP | 2001-303251 | 10/2001 |
| JP | 04-212411 | 8/1992 | JP | 2001-328900 | 11/2001 |
| JP | 04-260696 | 9/1992 | JP | 2000-212752 | 11/2002 |
| JP | 04-273120 | 9/1992 | WO | WO 90/02216 | 3/1990 |
| JP | 04-291916 | 9/1992 | WO | WO 91/10510 | 7/1991 |
| JP | 04-285167 | 10/1992 | WO | WO 93/02111 | 2/1993 |
| JP | 04-325500 | 11/1992 | WO | WO 96/17107 | 6/1996 |
| JP | 04-328874 | 11/1992 | WO | WO 96/18756 | 6/1996 |
| JP | 05-029228 | 2/1993 | WO | WO 98/06889 | 2/1998 |
| JP | 05-047665 | 2/1993 | WO | WO 98/51838 | 11/1998 |
| JP | 05-047668 | 2/1993 | WO | WO 99/01595 | 1/1999 |
| JP | 05-074717 | 3/1993 | WO | WO 99/13504 | 3/1999 |
| JP | 05-074724 | 3/1993 | WO | WO 99/29924 | 6/1999 |
| JP | 05-102189 | 4/1993 | WO | WO 99/41423 | 8/1999 |
| JP | 05-160152 | 6/1993 | WO | WO 99/65064 | 12/1999 |
| JP | 05-175143 | 7/1993 | WO | WO 00/11721 | 3/2000 |
| JP | 05-175145 | 7/1993 | WO | WO 00/15865 | 3/2000 |
| JP | 05-182906 | 7/1993 | WO | WO 00/15881 | 3/2000 |
| JP | 05-186295 | 7/1993 | WO | WO 00/16377 | 3/2000 |
| JP | 05-206036 | 8/1993 | WO | WO 00/54320 | 9/2000 |
| JP | 05-234899 | 9/1993 | WO | WO 00/63957 | 10/2000 |
| JP | 05-235047 | 9/1993 | WO | WO 00/75964 | 12/2000 |
| JP | 05-251339 | 9/1993 | WO | WO 00/79019 | 12/2000 |
| JP | 05-270997 | 10/1993 | WO | WO 00/79576 | 12/2000 |
| JP | 05-283336 | 10/1993 | WO | WO 01/15220 | 3/2001 |
| JP | 05-291152 | 11/1993 | WO | WO 01/17692 | 3/2001 |
| JP | 05-304334 | 11/1993 | WO | WO 01/27346 | 4/2001 |
| JP | 05-343327 | 12/1993 | WO | WO 01/27347 | 4/2001 |
| JP | 05-343685 | 12/1993 | WO | WO 01/29280 | 4/2001 |
| JP | 06-045606 | 2/1994 | WO | WO 01/29891 | 4/2001 |
| JP | 06-132236 | 5/1994 | WO | WO 01/29893 | 4/2001 |
| JP | 06-224138 | 5/1994 | WO | WO 01/36702 | 5/2001 |
| JP | 06-177381 | 6/1994 | WO | WO 01/40541 | 6/2001 |
| JP | 06-196809 | 7/1994 | WO | WO 01/66832 | 9/2001 |
| JP | 06-222388 | 8/1994 | WO | WO 01/88972 | 11/2001 |
| JP | 06-230421 | 8/1994 | WO | WO 02/01628 | 1/2002 |
| JP | 06-252057 | 9/1994 | WO | WO 02/08485 | 1/2002 |
| JP | 06-291048 | 10/1994 | WO | WO 02/08488 | 1/2002 |
| JP | 07-070752 | 3/1995 | WO | WO 02/31875 | 4/2002 |
| JP | 07-086269 | 3/1995 | WO | WO 02/43115 | 5/2002 |
| JP | 07-300649 | 11/1995 | WO | WO 02/45167 | 6/2002 |

| | | |
|---|---|---|
| WO | WO 02/45871 | 6/2002 |
| WO | WO 02/46489 | 6/2002 |
| WO | WO 02/065525 | 8/2002 |
| WO | WO 02/067319 | 8/2002 |
| WO | WO 03/023835 | 3/2003 |
| WO | WO 03/044242 | 5/2003 |
| WO | WO 2004/008491 | 1/2004 |
| WO | WO 2004/106584 | 12/2004 |
| WO | WO 2005/027211 | 3/2005 |

OTHER PUBLICATIONS

Bader, et al. "Integrated Processing Equipment", Solid State Technology, Cowan Pub., vol. 33, No. 5 (May 1, 1990), pp. 149-154.
Bedair "Atomic layer epitaxy deposition processes", J. Vac. Sci. Technol. 12(1) (Jan./Feb. 1994).
Buerke, et al. "PNL™ low Resistivity tungsten for contact fill," Conference Proceedings AMC XXI, 2006, Materials Research Society, pp. 221-226.
Cameron, et al. "Atomic Layer Deposition of $SiO_2$ and $TiO_2$ in Alumina Tubular Membranes," Langmuir, vol. 16, No. 19, American Chemical Society, 2000 pp. 7435-7444.
Cheong, et al. "The Evaluation of ALD-WN/W Process for Sub-10nm Contact Plug Technology," ALD 2005 Conference.
Choi, et al. "Stability of $TiB_2$ as a Diffusion Barrier on Silicon", J. Electrochem. Soc. 138(10) (Oct. 1991), pp. 3062-3067.
Choi, et al. "The effect of annealing on resistivity of low pressure chemical vapor depositied titanium diboride", J. Appl. Phys. 69(11) (Jun. 1, 1991), pp. 7853-7861.
Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).
Derbyshire "Applications of Integrated processing", Solid State Technology, US, Cowan Pub., vol. 37, No. 12 (Dec. 1, 1994), pp. 45-47.
Eisenbraun, et al. "Atomic Layer Deposition (ALD) of Tantalum-based materials for zero thickness copper barrier applications," Proceedings of the IEEE 2001 International Interconnect Technology Conference (Cat. No. 01EX461) 2001.
Elam, et al. "Nucleation and Growth During Tungsten Atomic Layer Deposition on $SiO_2$ Surfaces," Thin Solid Films, 386, (2001), pp. 41-52.
Elers, et al. "$NbCl_5$ as a presursor in atomic layer epitaxy", Appl. Surf. Sci., vol. 82/83 (1994), pp. 468-474.
European Search Report dated Sep. 23, 2005 from European Application No. 03257169.7. (APPM/006766EP).
Frohberg, et al. "Filling contacts using a pulsed nucleation later of tungsten nitride," Micro: TechEmergent, Mar. 27, 2006, pp. 1-10, http://www.micormagazine.com/archive/05/10/frohberg.html.
George, et al. "Atomic layer controlled deposition of $SiO_2$ and $Al_2O_3$ using ABAB . . . binary reaction sequence chemistry," Appl. Surf. Sci., vol. 82/83 (1994), pp. 460-467.
George, et al. "Surface Chemistry for Atomic Layer Growth", J. Phys. Chem., vol. 100 (1996), pp. 13121-13131.
Goswami, et al. "Transition Metals Show Promise as Copper Barriers," Semiconductor International, ATMI, San Jose—May 1, 2004, Semiconductor International, pp. 1-7.
Hong, et al. "Characteristics of PAALD-TaN thin films derived from Taimata precursor for copper metallization," Interconnect Technology Conference, 2004. Proceedings of the IEEE 2004 International, Jun. 7-9, 2004, pp. 9-11.
Hultman, et al. "Review of the thermal and mechanical stability of TiN-based thin films," Zeitschrift Fur Metallkunde, 90(10) (Oct. 1999), pp. 803-813.
Hwang, et al. "Nanometer-Size α-$PbO_2$-type $TiO_2$ in Garnet: A Thermobarometer for Ultrahigh-Pressure Metamorphism," Science Vo. 288 (Apr. 14, 2000).
IBM Tech. Disc. Bull. Knowledge-Based Dynamic Scheduler in Distributed Computer Control, (Jun. 1990), pp. 80-84.
IBM Tech. Disc. Bull. "Multiprocessor and Multitasking Architecture for Tool Control of the Advanced via Inspection Tools," (May 1992), pp. 190-191.

Jeong, et al. "Growth and Characterization of Aluminum Oxide ($Al_2O_3$) Thin Films by Plasma-Assisted Atomic Layer Controlled Deposition," J. Korean Inst. Met. Mater, vol. 38, No. 10, Oct. 2000, pp. 1395-1399.
Jeong, et al. "Plasma-assisted Atomic Layer Growth of High-Quality Aluminum Oxide Thin Films," Jpn. J. Appl. Phys. 1, vol. 40, No. 1, Jan. 2001, pp. 285-289.
Juppo, et al. "Deposition of Copper Films by an Alternate Supply of CuCl and Zn," Journal of Vacuum Science & Technology, vol. 15, No. 4 (Jul. 1997), pp. 2330-2333.
Kang "Application and challenges of atomic layer deposition for semiconductor process," AVS 5th International Conference on Atomic Layer Deposition 2005, Aug. 8-10, 2005, San Jose, CA.
Kim, et al. "Atomic layer deposited tungsten nitride thin films as contact barrier layer for sub-80 nm dynamic random access memory," Conference Proceedings AMC XXI, 2006 Materials Research Society.
Kim, et al. "Atomic Layer Deposition of Low Resistivity and High-Density Tungsten Nitride Thin Film Using $B_2H_6$, $WF_6$ and $NH_3$," Electrochem. Solid-State Lett., vol. 9, Issue 3, (2006), pp. C54-C57.
Kim, et al. "Substrate dependence on the optical properties of $Al_2O_3$ films grown by atomic layer deposition", Applied. Phys. Lett. 71 (25), Dec. 22, 1997, pp. 3604-3606.
Kitigawa, et al. "Hydrogen-mediated low temperature epitaxy of Si in plasma-enhanced chemical vapor deposition", Applied Surface Science (2000), pp. 30-34.
Klaus, et al. "Atomic Layer Deposition of $SiO_2$ Using Catalyzed and Uncatalyzed Self-Limiting Surface Reactions," Surface Review and Letters, vol. 6, Nos. 3 & 4 (1999) 435-448.
Klaus, et al. "Atomic Layer Deposition of Tungsten using Sequential Surface Chemistry with a Sacrificial Stripping Reaction" Thin Solid Films 360 (2000) (Accepted Nov. 16, 1999), pp. 145-153.
Klaus, et al. "Atomically Controlled Growth of Tungsten and Tungsten Nitride Using Sequential Surface Reactions," Applied Surface Science, 162-163 (2000), pp. 479-491.
Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; pp. 1670-1675.
Kukli, et al. "In situ Study of Atomic Layer Epitaxy Growth of Tantalum Oxide Thin Films from $Ta(OC_2H_5)_5$ and $H_2O$," Applied Surface Science, vol. 112, Mar. 1997, pp. 236-242.
Kukli, et al. "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy," 1997; pp. 785-793.
Kukli, et al. "Properties of $Ta_2O_5$-Based Dielectric Nanolaminates Deposited by Atomic Layer Epitaxy," Journal of the Electrochemical Society, vol. 144, No. 1, Jan. 1997; pp. 300-306.
Kukli, et al. "Tailoring the Dielectric Properties of $HfO_2$-$Ta_2$-$O_5$ Nanolaminates," Applied Physics Letters, vol. 68, No. 26, Jun. 24, 1996; pp. 3737-3739.
Lee "The Preparation of Titanium-Based Thin Film by CVD Using Titanium Chlorides as Precursors", Chemical Vapor Deposition, 5(2) (Mar. 1999), pp. 69-73.
Lee, et al. "Pulsed Nucleation for Ultra-High Aspect Ratio Tungsten Plugfill," Materials Research Society, 2002, pp. 649-653.
Martensson, et al. "Atomic Layer Epitaxy of Copper on Tantalum", Chemical Vapor Deposition, 3(1) (Feb. 1, 1997), pp. 45-50.
Martensson, et al. "Atomic Layer Epitaxy of Copper, Growth & Selectivity in the Cu (II)-2,2.6,6-Tetramethyl-3, 5-Heptanedion ATE/ H2 Process", J. Electrochem. Soc., 145(8) (Aug. 1998), pp. 2626-2931.
Martensson, et al. "Cu(THD)$_2$ as Copper Source in Atomic Layer Epitaxy," Electrochemical Society Proceedings vol. 97-25 (1997), pp. 1529-1536.
Martensson, et al. "Use of atomic Layer Epitaxy for Fabrication of Si/TiN/Cu Structures," J. Vac. Sci. & Tech. B, vol. 17, No. 5, (Sep. 1999) pp. 2122-2128.
Maydan "Cluster Tools for Fabrication of Advanced devices" Jap. J. of Applied Physics, Extended abstracts, 22nd Conference Solid State Devices and Materials (1990), pp. 849-852 XP000178141.
McGeachin "Synthesis and properties of some β-diketimines derived from acetylacetone, and their metal complexes", Canadian J. of Chemistry, vol. 46 (1968), pp. 1903-1912.

Min, et al. "Atomic Layer Deposition of TiN Thin Films by Sequential Introduction of Ti Precursor and NH₃," Mat. Res. Soc. Symp. Proc. vol. 514 (1998).

Min, et al. "Chemical Vapor Deposition of Ti-Si-N Films With Alternating Source Supply," Mat. Rec. Soc. Symp. Proc. vol. (1999).

Min, et al. "Metal-organic Atomic-layer Deposition-silicon-nitride films," Applied Physics Letters, vol. 75, No. 11 (Sep. 13, 1999).

Niinisto, et al. "Synthesis of Oxide Thin Films and Overlayers by Atomic Layer Epitaxy for Advanced Applications," Materials Science and Engineering B41 (1996) 23-29.

Ohba, et al. "Thermal Decomposition of Methylhydrazine and Deposition Properties of CVD TiN Thin Films", Conference Proceedings, Advanced Metallization for ULSI Applications in 1993 (1994), pp. 143-149.

Paranjpe, et al. "Atomic Layer Deposition of AlO$_x$ for Thin Film Head Gap Applications," J. Elec. Soc., vol. 148, No. 9 Sep. 2001 pp. G465-G471.

Park, et al. "Performance improvement of Mosfet with HfO$_2$Al$_2$O$_3$ laminate gate dielectric and CVD-TaN metal gate deposited by Taimata", Electron Devices Meeting, 2003. IEDM '03 Technical Digest. IEEE International Dec. 8-10, 2003, pp. 13.6.1-13.6.4.

PCT International Search Report dated May 30, 2003 for International Application No. PCT/US02/28715.

PCT Written Opinion dated Jul. 28, 2004 for International Application No. PCT/US02/28715.

Proceedings of the ICEEE 1998 International Interconnect Technology Conference—San Francisco, California, Jun. 1-3, 1998.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Deposition of Oxide Thin Films with Metal Alkoxides as Oxygen Sources," Science vol. 288 Apr. 14, 2000.

Ritala, et al. "Atomic Layer Epitaxy Growth of TiN Thin Films From TiI$_4$ and NH$_3$," J. Electrochem. Soc., vol. 145, No. 8 (Aug. 1998) pp. 2914-2920.

Ritala, et al. "Atomic Layer Epitaxy Growth of TiN Thin Films," J. Electrochem. Soc., vol. 142, No. 8, Aug. 1995.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Perfectly Conformal TiN and Al$_2$O$_3$ Films Deposited by Atomic Layer Deposition," Chemical Vapor Deposition, Jan. 1999, 5, No. 1, pp. 6-9.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Scheper, et al. "Low-temperature deposition of titanium nitride films from dialkylhydrazine-based precursors", Materials Science in Semiconductor Processing 2 (1999), pp. 149-157.

Shenai, et al. "Correlation of vapor pressure equation and film properties with trimethylindium purity for the MOVPE grown III-V compounds," Journal of Crystal Growth 248 (2003) pp. 91-98.

Solanki, et al., "Atomic Layer deposition of Copper Seed Layers", Electrochemical and Solid State Letters, 3(10) (2000), pp. 479-480.

Suzuki, et al., "A 0.2-µm contact filing by 450° C-hydrazine-reduced TiN film with low resistivity", IEDM 92-979, pp. 11.8.1-11.8.3.

Suzuki, et al., "LPCVD-TiN Using Hydrazine and TiCl$_4$", VMIC Conference (Jun. 8-9, 1993), pp. 418-423.

Ultrianen, et al. "Studies of Metallic Thin Film Growth in an Atomic Layer Epitaxy Reactor Using M(acac)$_2$(M=Ni,Cu,Pt) Precursors," Applied Surface Science, vol. 157, No. 3 (2000), pp. 151-158.

Wise, et al. "Diethyldiethoxysilane as a new precursor for SiO$_2$ growth on silicon", Mat. Res. Soc. Symp. Proc., vol. 334 (1994), pp. 37-43.

Yamaga, et al. "Atomic layer epitaxy of ZnS by a new gas supplying system in a low-pressure metalorganic vapor phase epitaxy", J. of Crystal Growth 117 (1992), pp. 152-155.

Yamaguchi, et al. "Atomic-layer chemical-vapor-deposition of silicon dioxide films with extremely low hydrogen content", Appl. Surf. Sci., vol. 130-132 (1998), pp. 202-207.

Yang, et al. "Atomic Layer Deposition of Tungsten Film from WF$_6$/B$_2$H$_6$: Nucleation Layer for Advanced Semiconductor Devices," Conference Proceedings ULSI XVII (2002), Materials Research Society, pp. 655-660.

Chinese Office Action dated Aug. 3, 2007 for Chinese Application No. 02821308.4.

* cited by examiner

APPARATUS FOR INTEGRATION OF BARRIER LAYER AND SEED LAYER

CROSS-REFERENCE TO RELATED APPLICATIONS

This application is a continuation of U.S. Ser. No. 11/064,274 (APPM/006303.C1), filed Feb. 22, 2005, now U.S. Pat. No. 7,352,048 which is a continuation of U.S. Ser. No. 09/965,373 (APPM/006303.02), filed Sep. 26, 2001, and issued as U.S. Pat. No. 6,936,906, which are herein incorporated by reference in their entirety.

BACKGROUND OF THE INVENTION

1. Field of the Invention

Embodiments of the invention generally relate to an apparatus and method for depositing a barrier layer and a seed layer thereon, and more particularly, to an apparatus and method for depositing a barrier layer containing tantalum and depositing a seed layer containing copper or other metals.

2. Description of the Related Art

Reliably producing sub-micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of vias, contacts and other features, as well as the dielectric materials between them, decrease to sub-micron dimensions (e.g., less than 0.20 µm or less), whereas the thickness of the dielectric layers remains substantially constant, with the result that the aspect ratios for the features, i.e., their height divided by width, increase. Many traditional deposition processes have difficulty filling sub-micron structures where the aspect ratio exceeds 4:1, and particularly where the aspect ratio exceeds 10:1. Therefore, there is a great amount of ongoing effort being directed at the formation of substantially void-free and seam-free sub-micron features having high aspect ratios.

Currently, copper and its alloys have become the metals of choice for sub-micron interconnect technology because copper has a lower resistivity than aluminum, (1.7 µΩ-cm compared to 3.1 µΩ-cm for aluminum), and a higher current carrying capacity and significantly higher electromigration resistance. These characteristics are important for supporting the higher current densities experienced at high levels of integration and increased device speed. Further, copper has a good thermal conductivity and is available in a highly pure state.

Copper metallization can be achieved by a variety of techniques. A typical method generally comprises physical vapor depositing a barrier layer over a feature, physical vapor depositing a copper seed layer over the barrier layer, and then electroplating a copper conductive material layer over the copper seed layer to fill the feature. Finally, the deposited layers and the dielectric layers are planarized, such as by chemical mechanical polishing (CMP), to define a conductive interconnect feature.

However, one problem with the use of copper is that copper diffuses into silicon, silicon dioxide, and other dielectric materials which may compromise the integrity of devices. Therefore, conformal barrier layers become increasingly important to prevent copper diffusion. Tantalum nitride has been used as a barrier material to prevent the diffusion of copper into underlying layers. One problem with prior uses of tantalum nitride and other barrier layers, however, is that these barrier layers are poor wetting agents for the deposition of copper thereon which may cause numerous problems. For example, during deposition of a copper seed layer over these barrier layers, the copper seed layer may agglomerate and become discontinuous, which may prevent uniform deposition of a copper conductive material layer (i.e., electroplating of a copper layer) over the copper seed layer. In another example, subsequent processing at high temperatures of a substrate structure having a copper layer deposited over these barrier layers may cause dewetting and the formation of voids in the copper layer. In still another example, thermal stressing of formed devices through use of the devices may cause the generation of voids in the copper layer and device failure.

Thus, there is a need for an improved apparatus and method for depositing barrier and seed materials.

SUMMARY OF THE INVENTION

Embodiments of the invention generally relates to apparatuses and methods for depositing a barrier layer, depositing a seed layer over the barrier layer, and depositing a conductive layer over the seed layer. In one embodiment, the seed layer comprises a copper alloy seed layer deposited over the barrier layer. For example, the copper alloy seed layer may comprise copper and a metal, such as aluminum, magnesium, titanium, zirconium, tin, and combinations thereof. In another embodiment, the seed layer comprises a copper alloy seed layer deposited over the barrier layer and a second seed layer deposited over the copper alloy seed layer. The copper alloy seed layer may comprise copper and a metal, such as aluminum, magnesium, titanium, zirconium, tin, and combinations thereof. The second seed layer may comprise a metal, such as undoped copper. In still another embodiment, the seed layer comprises a first seed layer and a second seed layer. The first seed layer may comprise a metal, such as aluminum, magnesium, titanium, zirconium, tin, and combinations thereof. The second seed layer may comprise a metal, such as undoped copper.

BRIEF DESCRIPTION OF THE DRAWINGS

So that the manner in which the above recited features, advantages, and objects of embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Process Chamber Adapted for Depositing a Barrier Layer

Figure 1:
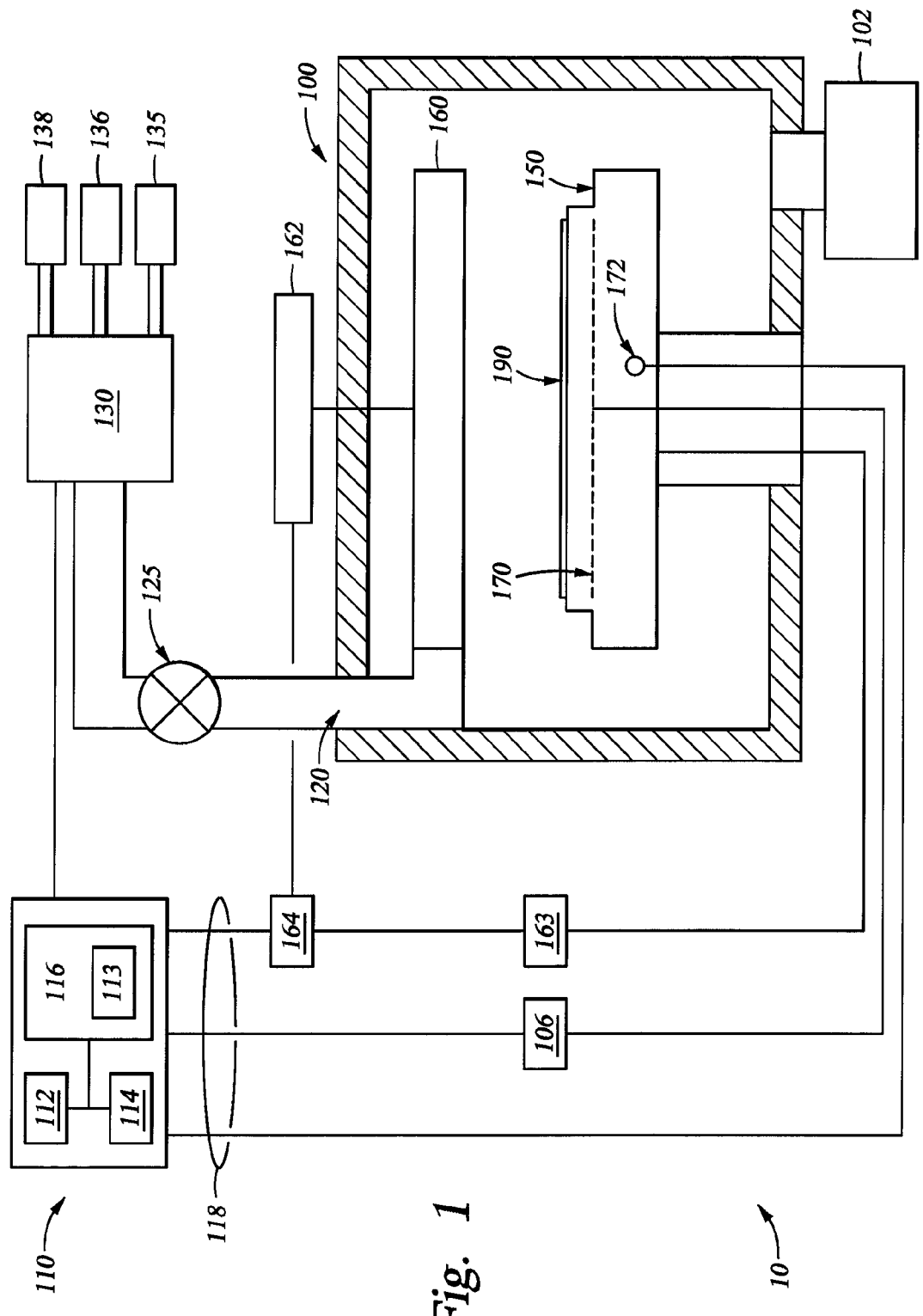
FIG. 1 is a schematic cross-sectional view of one embodiment of a processing system that may be used to form one or more barrier layers by atomic layer deposition.

FIG. 1 is a schematic cross-sectional view of one exemplary embodiment of a processing system 10 that may be used to form one or more barrier layers by atomic layer deposition in accordance with aspects of the present invention. Of course, other processing systems may also be used.

The process system 10 generally includes a process chamber 100, a gas panel 130, a control unit 110, a power supply 106, and a vacuum pump 102. The process chamber 100 generally houses a support pedestal 150, which is used to support a substrate such as a semiconductor wafer 190 within the process chamber 100.

In the chamber 100, the support pedestal 150 may be heated by an embedded heating element 170. For example, the pedestal 150 may be resistively heated by applying an electric current from an AC power supply to the heating element 170. The wafer 190 is, in turn, heated by the pedestal 150, and may be maintained within a desired process temperature range, for example, between about 20° C. and about 1,000° C. depending on the specific process.

A temperature sensor 172, such as a thermocouple, may be embedded in the wafer support pedestal 150 to monitor the pedestal temperature. For example, the measured temperature may be used in a feedback loop to control electric current applied to the heating element 170 from the power supply 106, such that the wafer temperature can be maintained or controlled at a desired temperature or within a desired temperature range suitable for a certain process application. The pedestal 150 may also be heated using radiant heat (not shown) or other heating methods.

The vacuum pump 102 may be used to evacuate process gases from the process chamber 100 and may be used to help maintain a desired pressure or desired pressure within a pressure range inside the chamber 100. An orifice 120 through a wall of the chamber 100 is used to introduce process gases into the process chamber 100. The size of the orifice 120 conventionally depends on the size of the process chamber 100.

The orifice 120 is coupled to the gas panel 130 in part by a valve 125. The gas panel 130 may be configured to receive and then provide a resultant process gas from two or more gas sources 135, 136 to the process chamber 100 through the orifice 120 and the valve 125. The gas sources 135, 136 may store precursors in a liquid phase at room temperature, which are later heated when in the gas panel 130 to convert them to a vapor-gas phase for introduction into the chamber 100. The gas sources 135, 136 may also be adapted to provide precursors through the use of a carrier gas. The gas panel 130 may be further configured to receive and then provide a purge gas from a purge gas source 138 to the process chamber 100 through the orifice 120 and the valve 125. A showerhead 160 may be coupled to the orifice 120 to deliver a process gas, purge gas, or other gas toward the wafer 190 on the support pedestal 150.

The showerhead 160 and the support pedestal 150 may serve as spaced apart electrodes for providing an electric field for igniting a plasma. A RF power source 162 may be coupled to the showerhead 160, a RF power source 163 may be coupled to the support pedestal 150, or RF power sources 162, 163 may be coupled to the showerhead 160 and the support pedestal 150, respectively. A matching network 164 may be coupled to the RF power sources 162, 163, which may be coupled to the control unit 110 to control the power supplied to the RF power sources 162, 163.

The control unit 110, such as a programmed personal computer, work station computer, and the like, may also be configured to control flow of various process gases through the gas panel 130 as well as the valve 125 during different stages of a wafer process sequence. Illustratively, the control unit 110 comprises a central processing unit (CPU) 112, support circuitry 114, and memory 116 containing associated control software 113. In addition to control of process gases through the gas panel 130, the control unit 110 may be configured to be responsible for automated control of other activities used in wafer processing-such as wafer transport, temperature control, chamber evacuation, among other activities, some of which are described elsewhere herein.

The control unit 110 may be one of any form of general purpose computer processor that can be used in an industrial setting for controlling various chambers and sub-processors. The CPU 112 may use any suitable memory 116, such as random access memory, read only memory, floppy disk drive, hard disk, or any other form of digital storage, local or remote. Various support circuits may be coupled to the CPU 112 for supporting the system 10. Software routines 113 as required may be stored in the memory 116 or executed by a second computer processor that is remotely located (not shown). Bi-directional communications between the control unit 110 and various other components of the wafer processing system 10 are handled through numerous signal cables collectively referred to as signal buses 118, some of which are illustrated in FIG. 1.

Barrier Layer Formation

Figure 2A:
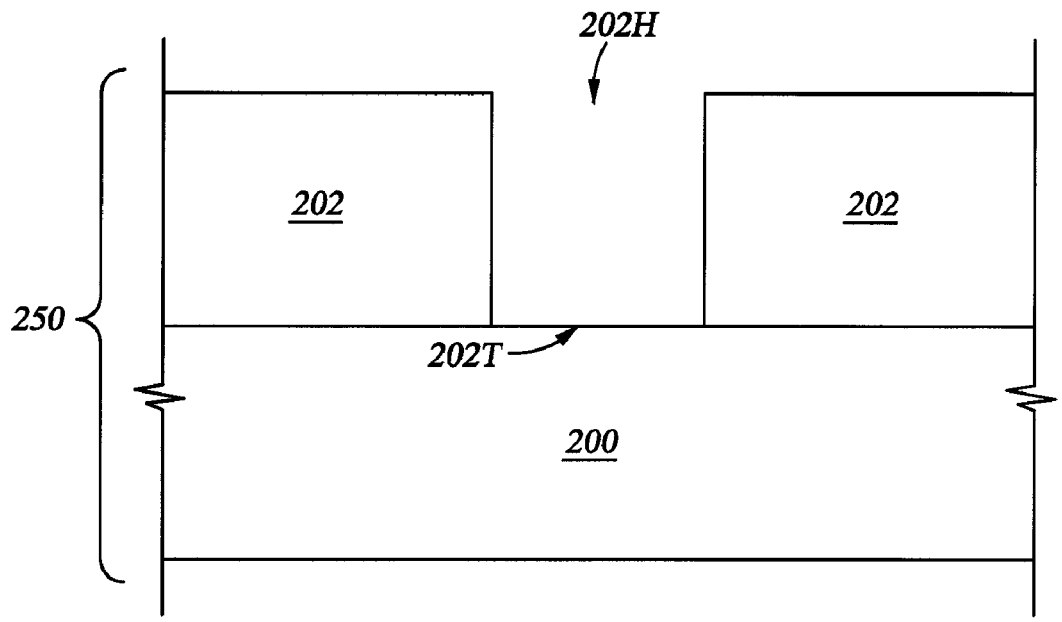
FIG. 2A is a schematic cross-sectional view of one embodiment of a substrate having a dielectric layer deposited thereon.
Figure 2B:
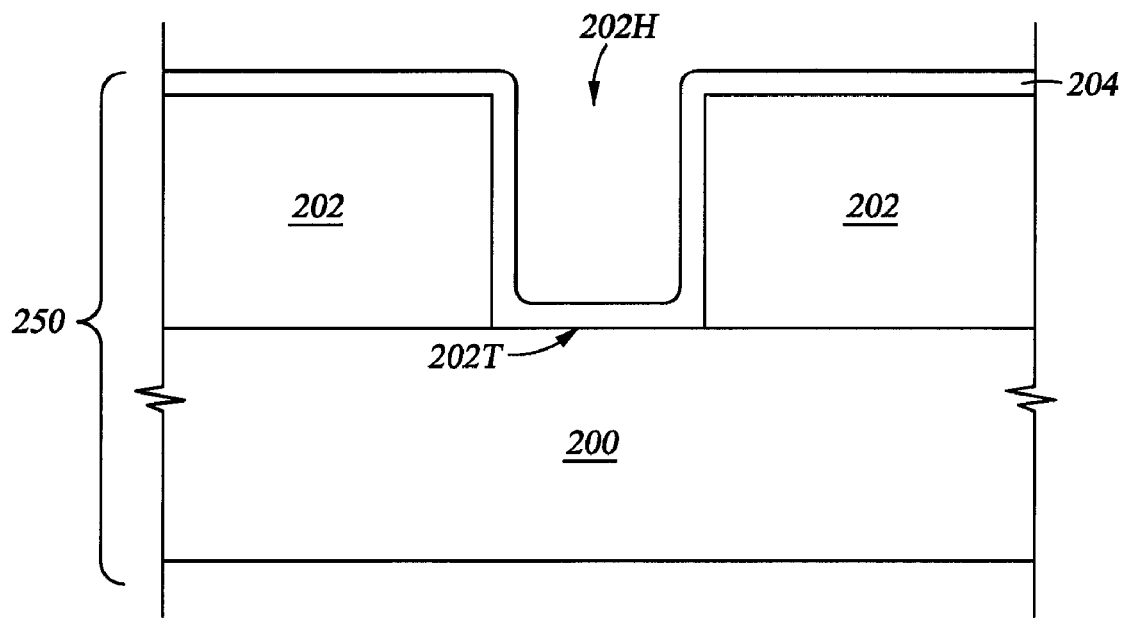
FIG. 2B is a schematic cross-sectional view of one embodiment of a barrier layer formed over the substrate structure of FIG. 2A.

The exemplary chamber as described in FIG. 1 may be used to implement the following process. Of course, other process chambers may be used. FIGS. 2A-2B illustrate one exemplary embodiment of barrier layer formation for fabrication of an interconnect structure in accordance with one or more aspects of the present invention.

FIG. 2A is a schematic cross-sectional view of one embodiment of a substrate 200 having a dielectric layer 202 deposited thereon. Depending on the processing stage, the substrate 200 may be a silicon semiconductor wafer, or other material layer, which has been formed on the wafer. The dielectric layer 202 may be an oxide, a silicon oxide, carbon-silicon-oxide, a fluoro-silicon, a porous dielectric, or other suitable dielectric formed and patterned to provide a contact hole or via 202H extending to an exposed surface portion 202T of the substrate 200. For purposes of clarity, the substrate 200 refers to any workpiece upon which film processing is performed, and a substrate structure 250 is used to denote the substrate 200 as well as other material layers formed on the substrate 200, such as the dielectric layer 202. It is also understood by those with skill in the art that the present invention may be used in a dual damascene process flow.

FIG. 2B is a schematic cross-sectional view of one embodiment of a barrier layer 204 formed over the substrate structure 250 of FIG. 2A by atomic layer deposition (ALD). Preferably, the barrier layer comprises a tantalum nitride layer. Examples of other barrier layer materials which may be used include titanium (Ti), titanium nitride (TiN), titanium silicon nitride (TiSiN), tantalum (Ta), tantalum silicon nitride (TaSiN), tungsten (W), tungsten nitride (WN), tungsten silicon nitride (WSiN), and combinations thereof.

For clarity reasons, deposition of the barrier layer will be described in more detail in reference to one embodiment of the barrier layer comprising a tantalum nitride barrier layer. In one aspect, atomic layer deposition of a tantalum nitride barrier layer comprises sequentially providing a tantalum containing compound and a nitrogen containing compound to a process chamber, such as the process chamber of FIG. 1. Sequentially providing a tantalum containing compound and a nitrogen containing compound may result in the alternating chemisorption of monolayers of a tantalum containing compound and of monolayers of a nitrogen containing compound on the substrate structure 250.

Figure 3A:
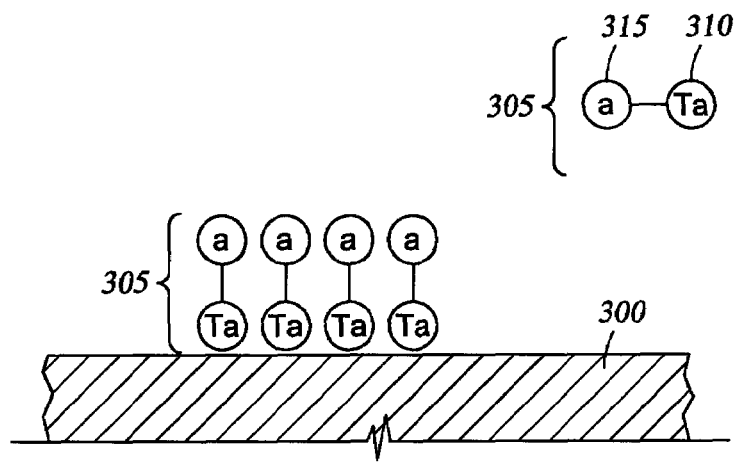
FIGS. 3A-3C illustrate one embodiment of alternating chemisorption of monolayers of a tantalum containing compound and a nitrogen containing compound on a portion of substrate at a stage of barrier layer formation.
Figure 3B:
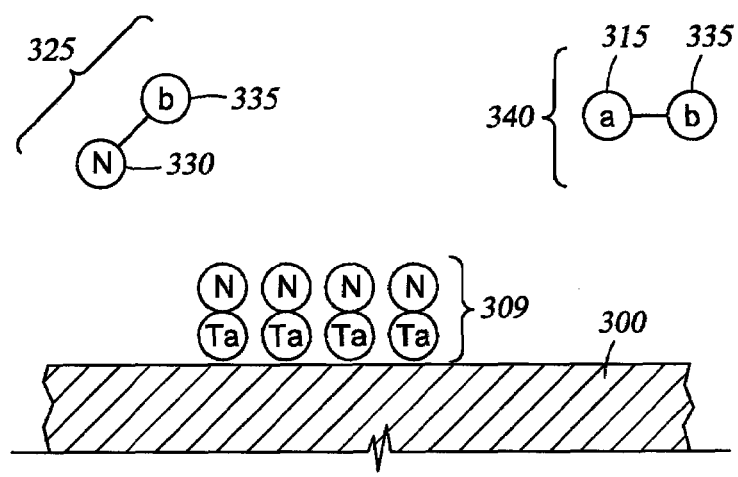
Figure 3C:
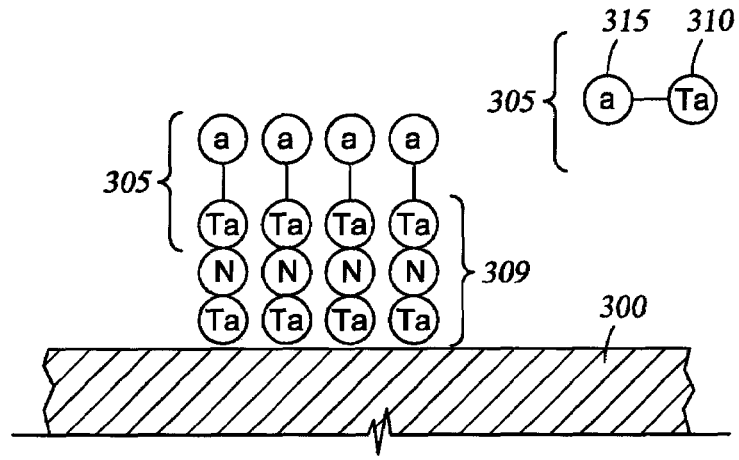

FIGS. 3A-3C illustrate one embodiment of the alternating chemisorption of monolayers of a tantalum containing compound and a nitrogen containing compound on an exemplary portion of substrate 300 in a stage of integrated circuit fabrication, and more particularly at a stage of barrier layer formation. In FIG. 3A, a monolayer of a tantalum containing compound is chemisorbed on the substrate 300 by introducing a pulse of the tantalum containing compound 305 into a process chamber, such as a process chamber shown in FIG. 1. It is believed that the chemisorption processes used to absorb the monolayer of the tantalum containing compound 305 are self-limiting in that only one monolayer may be chemisorbed onto the surface of the substrate 300 during a given pulse because the surface of the substrate has a finite number of sites for chemisorbing the tantalum containing compound. Once the finite number of sites is occupied by the tantalum containing compound 305, further chemisorption of any tantalum containing compound will be blocked.

The tantalum containing compound 305 typically comprises tantalum atoms 310 with one or more reactive species 315. In one embodiment, the tantalum containing compound may be a tantalum based organometallic precursor or a derivative thereof. Preferably, the organometallic precursor is penta(dimethylamino)-tantalum (PDMAT; $Ta(NMe_2)_5$). PDMAT may be used to advantage for a number of reasons. PDMAT is relatively stable. PDMAT has an adequate vapor pressure which makes it easy to deliver. In particular, PDMAT may be produced with a low halide content. The halide content of PDMAT may be produced with a halide content of less than 100 ppm, and may even be produced with a halide content of less than 30 ppm or even less than 5 ppm. Not wishing to be bound by theory, it is believed that an organometallic precursor with a low halide content is beneficial because halides (such as chlorine) incorporated in the barrier layer may attack the copper layer deposited thereover.

The tantalum containing compounds may be other organometallic precursors or derivatives thereof such as, but not limited to penta(ethylmethylamino)-tantalum (PEMAT; $Ta(N(Et)Me)_5$), penta(diethylamino)-tantalum (PDEAT; $Ta(NEt_2)_5$), and any and all of derivatives of PEMAT, PDEAT, or PDMAT. Other tantalum containing compounds include without limitation TBTDET ($Ta(NEt_2)_3NC_4H_9$ or $C_{16}H_{39}N_4Ta$) and tantalum halides, for example $TaX_5$ where X is fluorine, bromine, or chlorine, and derivatives thereof.

The tantalum containing compound may be provided as a gas or may be provided with the aid of a carrier gas. Examples of carrier gases which may be used include, but are not limited to, helium (He), argon (Ar), nitrogen ($N_2$), and hydrogen ($H_2$).

After the monolayer of the tantalum containing compound is chemisorbed onto the substrate 300, excess tantalum containing compound is removed from the process chamber by introducing a pulse of a purge gas thereto. Examples of purge gases which may be used include, but are not limited to, helium, argon, nitrogen ($N_2$), hydrogen ($H_2$), and other gases.

Referring to FIG. 3B, after the process chamber has been purged, a pulse of a nitrogen containing compound 325 is introduced into the process chamber. The nitrogen containing compound 325 may be provided alone or may be provided with the aid of a carrier gas. The nitrogen containing compound 325 may comprise nitrogen atoms 330 with one or more reactive species 335. The nitrogen containing compound preferably comprises ammonia gas ($NH_3$). Other nitrogen containing compounds may be used which include, but are not limited to, $N_xH_y$ with x and y being integers (e.g., hydrazine ($N_2H_4$)), dimethyl hydrazine (($CH_3)_2N_2H_2$), t-butylhydrazine ($C_4H_9N_2H_3$), phenylhydrazine ($C_6H_5N_2H_3$), other hydrazine derivatives, a nitrogen plasma source (e.g., $N_2$, $N_2/H_2$, $NH_3$, or a $N_2H_4$ plasma), 2,2'-azotertbutane (($CH_3)_6C_2N_2$), ethylazide ($C_2H_5N_3$), and other suitable gases. A carrier gas may be used to deliver the nitrogen containing compound if necessary.

A monolayer of the nitrogen containing compound 325 may be chemisorbed on the monolayer of the tantalum containing compound 305. The composition and structure of precursors on a surface during atomic-layer deposition (ALD) is not precisely known. Not wishing to be bound by theory, it is believed that the chemisorbed monolayer of the nitrogen containing compound 325 reacts with the monolayer of the tantalum containing compound 305 to form a tantalum nitride layer 309. The reactive species 315, 335 form by-products 340 that are transported from the substrate surface by the vacuum system. It is believed that the reaction of the nitrogen containing compound 325 with the tantalum containing compound 305 is self-limited since only one monolayer of the tantalum containing compound 305 was chemisorbed onto the substrate surface. In another theory, the precursors may be in an intermediate state when on a surface of the substrate. In addition, the deposited tantalum nitride layer may also contain more than simply elements of tantalum or nitrogen, rather, the tantalum nitride layer may also contain more complex molecules having carbon, hydrogen, and/or oxygen.

After the monolayer of the nitrogen containing compound 325 is chemisorbed on the monolayer of the tantalum containing compound, any excess nitrogen containing compound is removed from the process chamber by introducing another pulse of the purge gas therein. Thereafter, as shown in FIG. 3C, the tantalum nitride layer deposition sequence of alternating chemisorption of monolayers of the tantalum containing compound and of the nitrogen containing compound may be repeated, if necessary, until a desired tantalum nitride thickness is achieved.

In FIGS. 3A-3C, the tantalum nitride layer formation is depicted as starting with the chemisorption of a monolayer of a tantalum containing compound on the substrate followed by a monolayer of a nitrogen containing compound. Alternatively, the tantalum nitride layer formation may start with the chemisorption of a monolayer of a nitrogen containing compound on the substrate followed by a monolayer of the tantalum containing compound. Furthermore, in an alternative embodiment, a pump evacuation alone between pulses of reactant gases may be used to prevent mixing of the reactant gases.

The time duration for each pulse of the tantalum containing compound, the nitrogen containing compound, and the purge gas is variable and depends on the volume capacity of a deposition chamber employed as well as a vacuum system coupled thereto. For example, (1) a lower chamber pressure of a gas will require a longer pulse time; (2) a lower gas flow rate will require a longer time for chamber pressure to rise and stabilize requiring a longer pulse time; and (3) a large-volume chamber will take longer to fill, longer for chamber pressure to stabilize thus requiring a longer pulse time. Similarly, time between each pulse is also variable and depends on volume capacity of the process chamber as well as the vacuum system coupled thereto. In general, the time duration of a pulse of the tantalum containing compound or the nitrogen containing compound should be long enough for chemisorption of a monolayer of the compound. In general, the pulse time of the purge gas should be long enough to remove the reaction by-products and/or any residual materials remaining in the process chamber.

Generally, a pulse time of about 1.0 second or less for a tantalum containing compound and a pulse time of about 1.0 second or less for a nitrogen containing compound are typically sufficient to chemisorb alternating monolayers on a substrate. A pulse time of about 1.0 second or less for a purge gas is typically sufficient to remove reaction by-products as well as any residual materials remaining in the process chamber. Of course, a longer pulse time may be used to ensure chemisorption of the tantalum containing compound and the nitrogen containing compound and to ensure removal of the reaction by-products.

During atomic layer deposition, the substrate may be maintained approximately below a thermal decomposition temperature of a selected tantalum containing compound. An exemplary heater temperature range to be used with tantalum containing compounds identified herein is approximately between about 20° C. and about 500° C. at a chamber pressure less than about 100 Torr, preferably less than about 50 Torr. When the tantalum containing gas is PDMAT, the heater temperature is preferably between about 100° C. and about 300° C., more preferably between about 175° C. and about 250° C. In other embodiments, it should be understood that other temperatures may be used. For example, a temperature above a thermal decomposition temperature may be used. However, the temperature should be selected so that more than 50 percent of the deposition activity is by chemisorption processes. In another example, a temperature above a thermal decomposition temperature may be used in which the amount of decomposition during each precursor deposition is limited so that the growth mode will be similar to an atomic layer deposition growth mode.

One exemplary process of depositing a tantalum nitride layer by atomic layer deposition in a process chamber, such as the process chamber of FIG. 1, comprises sequentially providing penta(dimethylamino)-tantalum (PDMAT) at a flow rate between about 100 sccm and about 1,000 sccm, and preferably between about 200 sccm and about 500 sccm, for a time period of about 1.0 second or less, providing ammonia at a flow rate between about 100 sccm and about 1,000 sccm, preferably between about 200 sccm and about 500 sccm, for a time period of about 1.0 second or less, and a purge gas at a flow rate between about 100 sccm and about 1,000 sccm, preferably between about 200 sccm and about 500 sccm for a time period of about 1.0 second or less. The heater temperature preferably is maintained between about 100° C. and about 300° C. at a chamber pressure between about 1.0 Torr and about 5.0 Torr. This process provides a tantalum nitride layer in a thickness between about 0.5 Å and about 1.0 Å per cycle. The alternating sequence may be repeated until a desired thickness is achieved.

In one embodiment, the barrier layer, such as a tantalum nitride barrier layer, is deposited to a sidewall coverage of about 50 Å or less. In another embodiment, the barrier layer is deposited to a sidewall coverage of about 20 Å or less. In still another embodiment, the barrier layer is deposited to a sidewall coverage of about 10 Å or less. A barrier layer with a thickness of about 10 Å or less is believed to be a sufficient barrier layer to prevent copper diffusion. In one aspect, a thin barrier layer may be used to advantage in filling sub-micron and smaller features having high aspect ratios. Of course, a barrier layer having a sidewall coverage of greater than 50 Å may be used.

The barrier layer may be further plasma annealed. In one embodiment, the barrier lay may be plasma annealed with an argon plasma or an argon/hydrogen plasma. The RF power supplied to an RF electrode may be between about 100 W and about 2,000 W, preferably between about 500 W and about 1,000 W for a 200 mm diameter substrate and preferably between about 1,000 W and about 2,000 W for a 300 mm diameter substrate. The pressure of the chamber may be less than 100 Torr, preferably between about 0.1 Torr and about 5 Torr, and more preferably between about 1 Torr and 3 Torr. The heater temperature may be between about 20° C. and about 500° C. The plasma anneal may be performed after a cycle, a plurality of cycles, or after formation of the barrier layer.

Embodiments of atomic layer deposition of the barrier layer have been described above as chemisorption of a monolayer of reactants on a substrate. The present invention also includes embodiments in which the reactants are deposited to more or less than a monolayer. The present invention also includes embodiments in which the reactants are not deposited in a self-limiting manner. The present invention also includes embodiments in which the barrier layer 204 is deposited in mainly a chemical vapor deposition process in which the reactants are delivered sequentially or simultaneously. The present invention also includes embodiments in which the barrier layer 204 is deposited in a physical vapor deposition process in which the target comprises the material to be deposited (i.e., a tantalum target in a nitrogen atmosphere for the deposition of tantalum nitride).

Process Chamber Adapted for Depositing a Seed Layer

In one embodiment, the seed layer may be deposited by any suitable technique such as physical vapor deposition, chemical vapor deposition, electroless deposition, or a combination of techniques. Suitable physical vapor deposition techniques for the deposition of the seed layer include techniques such as high density plasma physical vapor deposition (HDP PVD) or collimated or long throw sputtering. One type of HDP PVD is self-ionized plasma physical vapor deposition. An example of a chamber capable of self-ionized plasma physical vapor deposition of a seed layer is a SIP™ chamber, available from Applied Materials, Inc., of Santa Clara, Calif. Exemplary embodiments of chambers capable of self-ionized physical vapor deposition are described in U.S. Pat. No. 6,183,614, which is herein incorporated by reference to the extent not inconsistent with embodiments of the invention.

Figure 4:
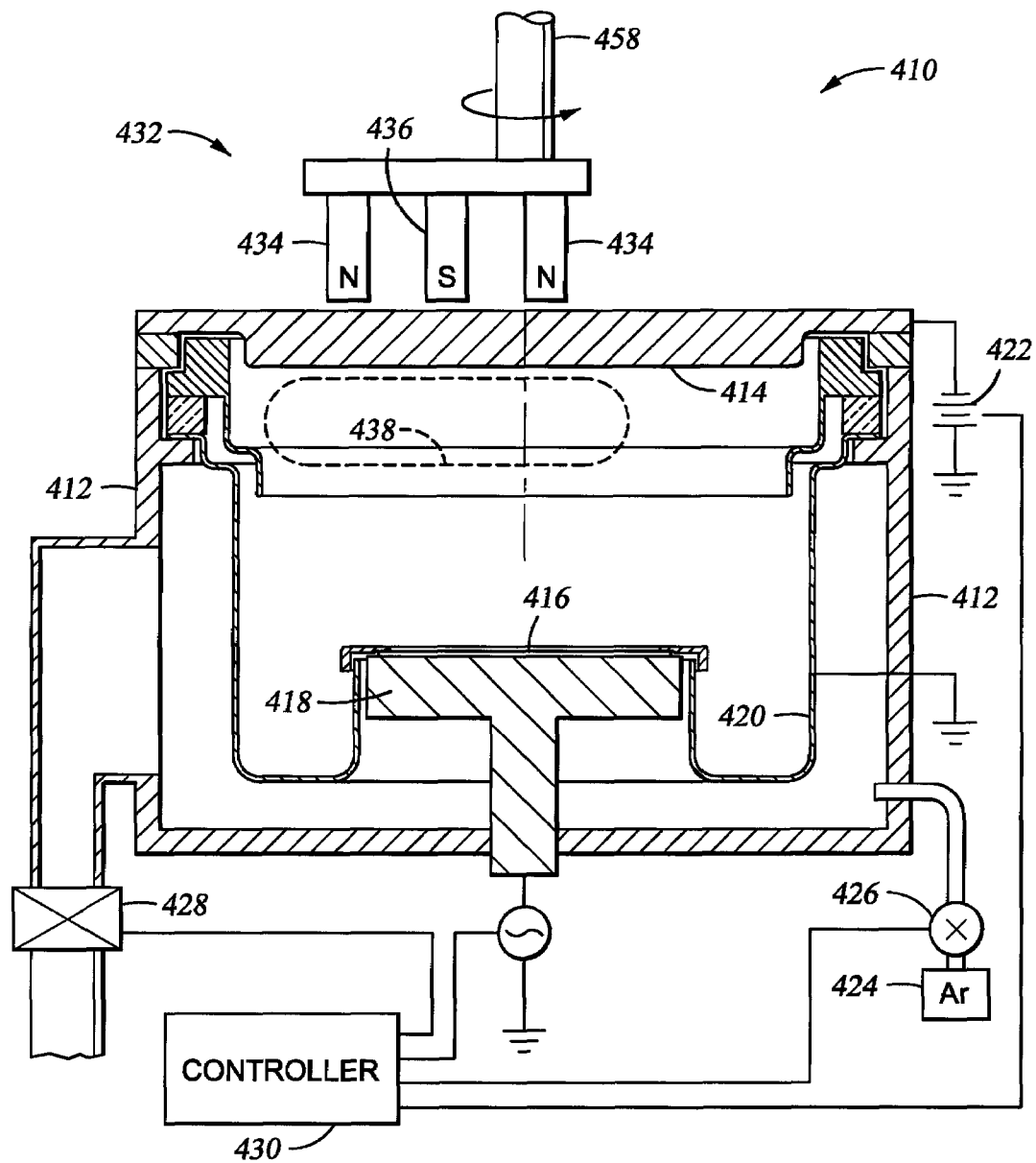
FIG. 4 is a schematic cross-sectional view of one embodiment of a process system capable of physical vapor deposition which may be used to deposit a copper alloy seed layer.

FIG. 4 is a schematic cross-sectional view of one embodiment of a process system 410 capable of physical vapor deposition which may be used to deposit a seed layer. Of course, other processing systems and other types of physical vapor deposition may also be used.

The process system 410 includes a chamber 412 sealed to a PVD target 414 composed of the material to be sputter deposited on a wafer 416 held on a heater pedestal 418. A shield 420 held within the chamber protects the walls of the chamber 412 from the sputtered material and provides the anode grounding plane. A selectable DC power supply 422 negatively biases the target 414 with respect to the shield 420.

A gas source 424 supplies a sputtering working gas, typically the chemically inactive gas argon, to the chamber 412 through a mass flow controller 426. A vacuum system 428 maintains the chamber at a low pressure. A computer-based controller 430 controls the reactor including the DC power supply 422 and the mass flow controllers 426.

When the argon is admitted into the chamber, the DC voltage between the target 414 and the shield 420 ignites the argon into a plasma, and the positively charged argon ions are attracted to the negatively charged target 414. The ions strike the target 414 at a substantial energy and cause target atoms or atomic clusters to be sputtered from the target 414. Some of the target particles strike the wafer 416 and are thereby deposited on it, thereby forming a film of the target material.

To provide efficient sputtering, a magnetron 432 is positioned in back of the target 414. It has opposed magnets 434, 436 creating a magnetic field within the chamber in the neighborhood of the magnets 434, 436. The magnetic field traps electrons and, for charge neutrality, the ion density also increases to form a high-density plasma region 438 within the chamber adjacent to the magnetron 432. The magnetron 432 usually rotates about a rotational axis 458 at the center of the target 414 to achieve full coverage in sputtering of the target 414.

The pedestal 418 develops a DC self-bias, which attracts ionized sputtered particles from the plasma across the plasma sheath adjacent to the wafer 416. The effect can be accentuated with additional DC or RF biasing of the pedestal electrode 418 to additionally accelerate the ionized particles extracted across the plasma sheath towards the wafer 416, thereby controlling the directionality of sputter deposition.

Seed Layer Formation

Figure 5A:
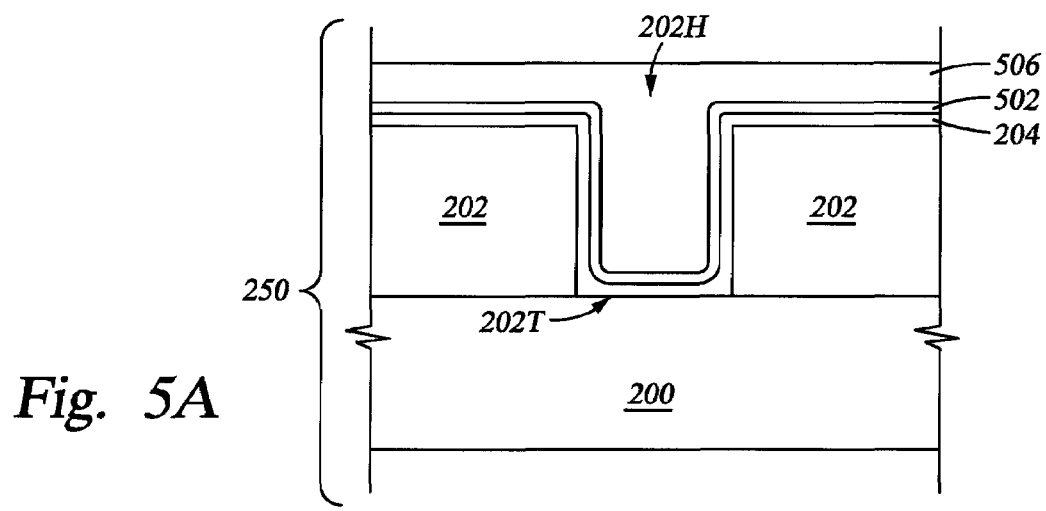
FIGS. 5A-5C are schematic cross-sectional views of embodiments of depositing a seed layer over a barrier layer of FIG. 2B.
Figure 5B:
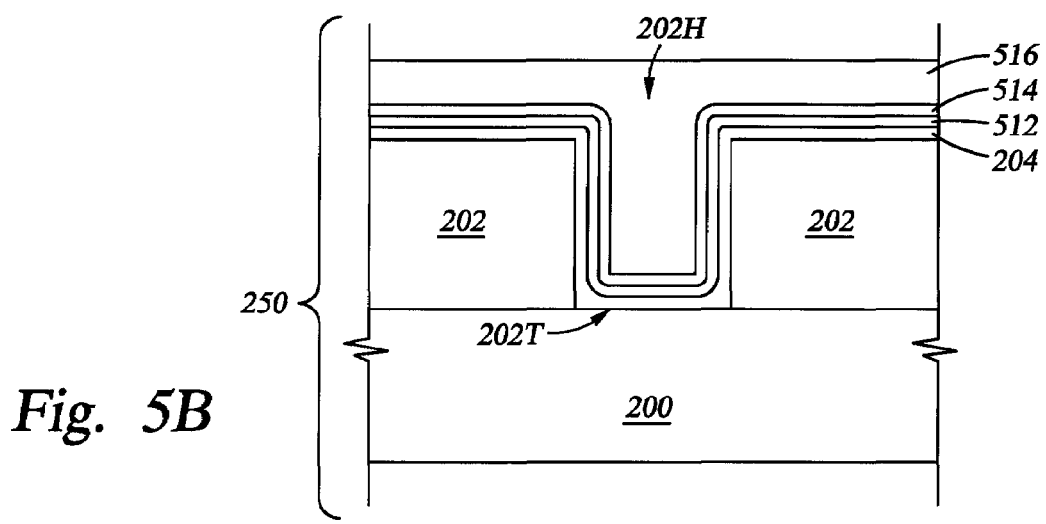
Figure 5C:
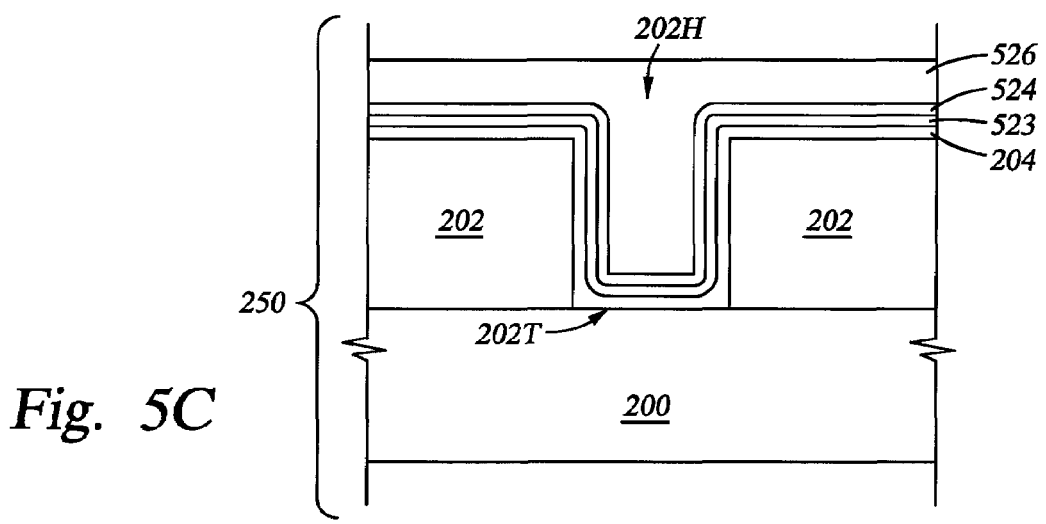

The exemplary chamber as described in FIG. 4 may be used to implement the following process. Of course, other process chambers may be used. FIGS. 5A-5C are schematic cross-sectional view of exemplary embodiments of depositing a seed layer over a barrier layer.

One embodiment, as shown in FIG. 5A, comprises depositing a copper alloy seed layer 502 over a barrier layer 204 of FIG. 2B and depositing a copper conductive material layer 506 over the copper alloy seed layer 502 to fill the feature. The term "copper conductive material layer" as used in the specification is defined as a layer comprising copper or a copper alloy. The copper alloy seed layer 502 comprises a copper metal alloy that aids in subsequent deposition of materials thereover. The copper alloy seed layer 502 may comprise copper and a second metal, such as aluminum, magnesium, titanium, zirconium, tin, other metals, and combinations thereof. The second metal preferably comprises aluminum, magnesium, titanium, and combinations thereof, and more preferably comprises aluminum. In certain embodiments, the copper alloy seed layer comprises a second metal in a concentration having the lower limits of about 0.001 atomic percent, about 0.01 atomic percent, or about 0.1 atomic percent and having the upper limits of about 5.0 atomic percent, about 2.0 atomic percent, or about 1.0 atomic percent. The concentration of the second metal in a range from any lower limit to any upper limit is within the scope of the present invention. The concentration of the second metal in the copper alloy seed layer 502 is preferably less than about 5.0 atomic percent to lower the resistance of the copper alloy seed layer 502. The term "layer" as used in the specification is defined as one or more layers. For example, for a copper alloy seed layer 502 comprising copper and a second metal in a concentration in a range between about 0.001 atomic percent and about 5.0 atomic percent, the copper alloy seed layer 502 may comprise a plurality of layers in which the total composition of the layers comprises copper and the second metal in a concentration between about 0.001 atomic percent and about 5.0 atomic percent. For illustration, examples of a copper alloy seed layer 502 comprising a plurality of layers in which the total composition of the layers comprises copper and the second metal in a concentration between about 0.001 atomic percent and about 5.0 atomic percent may comprises a first seed layer comprising the second metal and a second seed layer comprising copper, may comprise a first seed layer comprising a copper/second metal alloy and a second seed layer comprising a copper/second metal alloy, or may comprise a first seed layer comprising a copper/second metal alloy and a second seed layer comprising copper.

The copper alloy seed layer 502 is deposited to a thickness of at least about a 5 Å coverage of the sidewalls of the feature or to a thickness of at least a continuous coverage of the sidewalls of the feature. In one embodiment, the copper alloy seed layer 502 is deposited to a thickness at the field areas between about 10 Å and about 2,000 Å, preferably between about 500 Å and about 1,000 Å for a copper alloy seed layer 502 deposited by physical vapor deposition.

Another embodiment, as shown in FIG. 5B, comprises depositing a copper alloy seed layer 512 over a barrier layer 204 of FIG. 2B, depositing a second seed layer 514 over the copper alloy seed layer 512, and depositing a copper conductive material layer 516 over the second seed layer 514 to fill the feature. The copper alloy seed layer 512 comprises a copper metal alloy that aids in subsequent deposition of materials thereover. The copper alloy seed layer 512 may comprise copper and a second metal, such as aluminum, magnesium, titanium, zirconium, tin, other metals, and combinations thereof. The second metal preferably comprises aluminum, magnesium, titanium, and combinations thereof and more preferably comprises aluminum. In certain embodiments, the copper alloy seed layer comprises a second metal in a concentration having the lower limits of about 0.001 atomic percent, about 0.01 atomic percent, or about 0.1 atomic percent and having the upper limits of about 5.0 atomic percent, about 2.0 atomic percent, or about 1.0 atomic percent. The concentration of the second metal in a range from any lower limit to any upper limit is within the scope of the present invention. In one embodiment, the second seed layer 514 comprises undoped copper (i.e., pure copper). In one aspect, a second seed layer 514 comprising undoped copper is used because of its lower electrical resistivity than a copper alloy seed layer 512 of the same thickness and because of its higher resistance to surface oxidation.

The copper alloy seed layer 512 may be deposited to a thickness of less than a monolayer (e.g., a sub-monolayer thickness or a discontinuous layer) over the sidewalls of the feature. In one embodiment, the combined thickness of the copper alloy seed layer 512 and the second seed layer 514 at the field areas is between about 10 Å and about 2,000 Å, preferably between about 500 Å and about 1,000 Å for a copper alloy seed layer 512 and second seed layer 514 deposited by physical vapor deposition.

Another embodiment, as shown in FIG. 5C, comprises depositing a first seed layer 523 over a barrier layer 204 of FIG. 2B, depositing a second seed layer 524 over the first seed layer 523, and depositing a copper conductive material layer 526 over the second seed layer 524 to fill the feature. The first seed layer 523 comprises a metal selected from the group consisting of aluminum, magnesium, titanium, zirconium, tin, and combinations thereof. Preferably, the first seed layer 523 comprises aluminum. In one embodiment, the second seed layer 514 comprises undoped copper (e.g., pure copper).

The first seed layer 523 may be deposited to a thickness of less than a monolayer (i.e., a sub-monolayer thickness or a discontinuous layer) over the sidewalls of the feature. In one embodiment, the first seed layer is deposited to a thickness of less than about 50 Å sidewall coverage, preferably less than about 40 Å sidewall coverage, in order to lower the total resistance of the combined seed layer. The combined thickness of the first seed layer 523 and the second seed layer 524 at the field areas is between about 10 Å and about 2,000 Å, preferably between about 500 Å and about 1,000 Å for a first seed layer 523 and second seed layer 524 deposited by physical vapor deposition.

The copper alloy seed layer 502, 512, the first seed layer 523, or the second seed layer 514, 524 may be deposited by such techniques including physical vapor deposition, chemical vapor deposition, atomic layer deposition, electroless deposition, or a combination of techniques. In general, if a seed layer is deposited utilizing physical vapor deposition techniques, a chamber, such as the chamber 412 as described in FIG. 4, includes a target, such as target 414, having a composition similar to the metal or metal alloy intended to be deposited. For example, to deposit a copper alloy seed layer 502, 512 the target may comprise copper and a second metal, such as aluminum, magnesium, titanium, zirconium, tin, other metals, and combinations thereof. The second metal preferably comprises aluminum. In certain embodiments, the target comprises a second metal in a concentration having the lower limits of about 0.001 atomic percent, about 0.01 atomic percent, or about 0.1 atomic percent and having the upper limits of about 5.0 atomic percent, about 2.0 atomic percent, or about 1.0 atomic percent. The concentration of the second metal in a range from any lower limit to any upper limit is within the scope of the present invention. In another example, to deposit a first seed layer 523, the target comprises a metal selected from the group consisting of aluminum, magnesium, titanium, zirconium, tin, and combinations thereof. If a seed layer is deposited by chemical vapor deposition or atomic layer deposition, a chamber, such as the chamber as described in FIG. 1, is adapted to deliver suitable metal precursors of the metal or metal alloy to be deposited.

One exemplary process of depositing a seed layer by physical vapor deposition in a process chamber, such as the process chamber of FIG. 4, comprises utilizing a target of the material to be deposited. The process chamber may be maintained at a pressure of between about 0.1 mTorr and about 10 mTorr. The target may be DC-biased at a power between about 5 kW and about 100 kW. The pedestal may be RF-biased at a power between about 0 W and about 1,000 W. The pedestal may be unheated (i.e., room temperature).

The copper conductive material layer 506, 516, 526 may be deposited by electroplating, physical vapor deposition, chemical vapor deposition, electroless deposition or a combination of techniques. Preferably, the copper conductive material layer 506, 516, 526 is deposited by electroplating because of the bottom-up growth which may be obtained in electroplating processes. An exemplary electroplating method is described in U.S. Pat. No. 6,113,771, which is incorporated herein by reference to the extent not inconsistent with embodiments of the invention.

It has been observed that a copper alloy seed layer, such as a copper-aluminum seed layer, has improved adhesion over a barrier layer when compared to an undoped copper seed layer over the barrier layer. Because the copper alloy seed layer has good adhesion over a barrier layer, the copper alloy seed layer acts as a good wetting agent to materials deposited thereon. Not wishing to be bound by theory, it is believed that the concentration of the copper and other metals of the copper seed layer provides a seed layer with good wetting properties and good electrical characteristics. It is further believed that a copper alloy seed layer having a total thickness of less than a monolayer may be used as long as a second seed layer, such as an undoped seed layer, is deposited thereover to provide at least a combined continuous seed layer since the copper alloy seed layer provides an improved interface for adhesion of materials thereon.

Similarly, it has been observed that a metal seed layer, such as an aluminum seed layer, has improved adhesion over a barrier layer when compared to an undoped copper seed layer over the barrier layer. Because the metal seed layer has good adhesion over a barrier layer, the metal seed layer acts as a good wetting agent to materials deposited thereon. Not wishing to bound by theory, it is believed that a metal seed layer, such as an aluminum seed layer, having a total thickness of less than a monolayer may be used since the metal layer provides an improved interface for adhesion of materials thereon, such as an undoped copper seed layer deposited over the metal layer.

The seed layers as disclosed herein have improved adhesion over barrier layers and have good wetting properties for materials deposited thereover, such as a copper conductive material layer deposited thereover. Therefore, the seed layers increase device reliability by reducing the likelihood of agglomeration, dewetting, or the formation of voids in the copper conductive material layer during deposition of the copper conductive material layer, during subsequent processing at high temperatures, and during thermal stressing of the devices during use of the devices.

In one aspect, the seed layers may be used with any barrier layer and may be used with barrier layers deposited by any deposition technique. The seed layers also may be deposited by any deposition technique. Furthermore, a conductive material layer, such as a copper conductive material layer, may be deposited over the seed layers by any deposition technique.

The present process may be used to advantage in filling apertures having less than about 0.2 micron opening width and having an aspect ratio of greater than about 4:1, about 6:1, or about 10:1.

Figure 6:
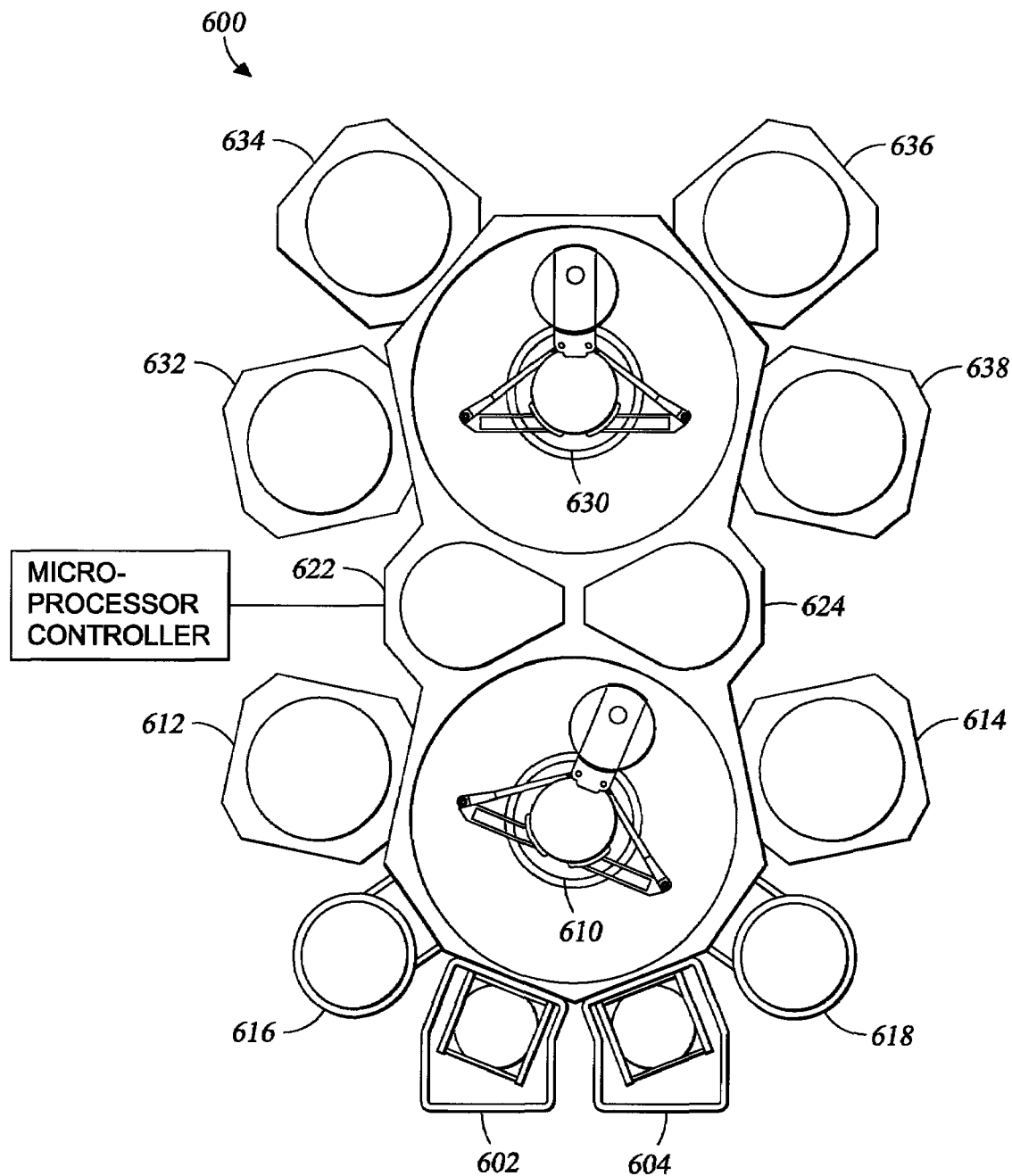
FIG. 6 is a schematic top-view diagram of one example of a multi-chamber processing system which may be adapted to perform processes as disclosed herein.

The processes as disclosed herein may be carried out in separate chambers or may be carried out in a multi-chamber processing system having a plurality of chambers. FIG. 6 is a schematic top-view diagram of one example of a multi-chamber processing system 600 which may be adapted to perform processes as disclosed herein. The apparatus is an ENDURA® system and is commercially available from Applied Materials, Inc., of Santa Clara, Calif. A similar multi-chamber processing system is disclosed in U.S. Pat. No. 5,186,718, which is hereby incorporated by reference to the extent not inconsistent with embodiments of the invention. The particular embodiment of the system 600 is provided to illustrate the invention and should not be used to limit the scope of the invention.

The system 600 generally includes load lock chambers 602, 604 for the transfer of substrates into and out from the system 600. Typically, since the system 600 is under vacuum, the load lock chambers 602, 604 may "pump down" the substrates introduced into the system 600. A first robot 610 may transfer the substrates between the load lock chambers 602, 604, processing chambers 612, 614, transfer chambers 622, 624, and other chambers 616, 618. A second robot 630 may transfer the substrates between processing chambers 632, 634, 636, 638 and the transfer chambers 622, 624. Processing chambers 612, 614, 632, 634, 636, 638 may be removed from the system 600 if not necessary for the particular process to be performed by the system 600.

In one embodiment, the system 600 is configured so that processing chamber 634 is adapted to deposit a copper alloy seed layer 502. For example, the processing chamber 634 for depositing a copper alloy seed layer 502 may be a physical vapor deposition chamber, a chemical vapor deposition chamber, or an atomic layer deposition chamber. The system 600 may be further configured so that processing chamber 632 is adapted to deposit a barrier layer 204 in which the copper alloy seed layer 502 is deposited over the barrier layer. For example, the processing chamber 632 for depositing the barrier layer 204 may be an atomic layer deposition chamber, a chemical vapor deposition chamber, or a physical vapor deposition chamber. In one specific embodiment, the processing chamber 632 may be an atomic layer deposition chamber, such as the chamber shown in FIG. 1, and the processing chamber 634 may be a physical vapor deposition chamber, such as the chamber shown in FIG. 4.

In another embodiment, the system 600 is configured so that processing chamber 634 is adapted to deposit a copper alloy seed layer 512 and so that processing chamber 636 is adapted to deposit a second seed layer 514 over the copper alloy seed layer 512. For example, the processing chamber 634 for depositing a copper alloy seed layer 512 and/or the processing chamber 636 for depositing a second seed layer may be a physical vapor deposition chamber, a chemical vapor deposition chamber, or an atomic layer deposition chamber. The system 600 may be further configured so that processing chamber 632 is adapted to deposit a barrier layer 204 in which the copper alloy seed layer 512 is deposited over the barrier layer. For example, the processing chamber 632 for depositing the barrier layer 204 may be an atomic layer deposition chamber, a chemical vapor deposition chamber, or a physical vapor deposition chamber. In one specific embodiment, processing chamber 632 may be an atomic layer deposition chamber, such as the chamber shown in FIG. 1, and processing chambers 634, 636 may be physical vapor deposition chambers, such as the chamber shown in FIG. 4.

In another embodiment, the system 600 is configured so that processing chamber 634 is adapted to deposit a metal seed layer 523 and so that processing chamber 636 is adapted to deposit a second seed layer 524 over the metal seed layer 523. For example, the processing chamber 634 for depositing a metal seed layer 523 and/or the processing chamber 636 for depositing a second seed layer 524 may be a physical vapor deposition chamber, a chemical vapor deposition chamber, or an atomic layer deposition chamber. The system may be further configured so that processing chamber 632 is adapted to deposit a barrier layer 204 in which the metal seed layer 523 is deposited over the barrier layer. For example, the processing chamber 632 for depositing the barrier layer 204 may be an atomic layer deposition chamber, a chemical vapor deposition chamber, or a physical vapor deposition chamber. In one specific embodiment, processing chamber 632 may be an atomic layer deposition chamber, such as the chamber shown in FIG. 1, and processing chambers 634, 636 may be physical vapor deposition chambers, such as the chamber shown in FIG. 4.

In one aspect, deposition of a barrier layer 204 and a seed layer (such as a copper alloy seed layer 502, a copper alloy seed layer 512 and a second seed layer 514, or a metal seed layer 523 and a second seed layer 524) may be performed in a multi-chamber processing system under vacuum to prevent air and other impurities from being incorporated into the layers and to maintain the seed structure over the barrier layer 204.

Other embodiments of the system 600 are within the scope of the present invention. For example, the position of a particular processing chamber on the system may be altered. In another example, a single processing chamber may be adapted to deposit two different layers.

EXAMPLES

Example 1

A TaN layer was deposited over a substrate by atomic layer deposition to a thickness of about 20 Å. A seed layer was deposited over the TaN layer by physical vapor deposition to a thickness of about 100 Å. The seed layer comprised either 1) undoped copper deposited utilizing a target comprising undoped copper, 2) a copper alloy comprising aluminum in a concentration of about 2.0 atomic percent deposited utilizing a copper-aluminum target comprising aluminum in a concentration of about 2.0 atomic percent, 3) a copper alloy comprising tin in a concentration of about 2.0 atomic percent deposited utilizing a copper-tin target comprising tin in a concentration of about 2.0 atomic percent, or 4) a copper alloy comprising zirconium in a concentration of about 2.0 atomic percent deposited utilizing a copper-zirconium target comprising zirconium in a concentration of about 2.0 atomic percent. The resulting substrate was annealed at a temperature of about 380° C. for a time period of about 15 minutes in a nitrogen ($N_2$) and hydrogen ($H_2$) ambient.

Scanning electron microscope photographs showed agglomeration of the undoped copper layer after the anneal. The copper-zirconium alloy showed less agglomeration than the undoped copper layer. The copper-tin alloy showed less agglomeration than the copper-zirconium alloy. The copper-aluminum alloy showed no significant agglomeration.

Example 2

Copper-aluminum alloy films comprising about 2.0 atomic percent of aluminum were deposited on different substrates by physical vapor deposition utilizing a copper-aluminum target comprising aluminum in a concentration of 2.0 atomic percent. The resulting substrates included 1) a copper-aluminum layer deposited to a thickness of about 50 Å over an ALD TaN layer, 2) a copper-aluminum layer deposited to a thickness of about 50 Å over about a 100 Å Ta layer, 3) a copper-aluminum layer deposited to a thickness of about 100 Å over an ALD TaN layer, 4) a copper-aluminum layer deposited to a thickness of about 100 Å over a silicon nitride (SiN) layer, and 5) a copper-aluminum layer deposited to a thickness of about 100 Å over a silicon oxide layer. The resulting substrates were annealed at a temperature of about 380° C. for a time period of about 15 minutes in a nitrogen ($N_2$) and hydrogen ($H_2$) ambient. Scanning electron microscope photographs showed that there was no significant agglomeration of the copper-aluminum alloy over the various substrates.

Example 3

Copper-aluminum alloy films comprising about 2.0 atomic percent of aluminum were deposited by physical vapor deposition utilizing a copper-aluminum target comprising aluminum in a concentration of 2.0 atomic percent to either a 50 Å or 100 Å thickness over an ALD TaN layer. The resulting substrates were annealed at a temperature of about 380° C., about 450° C., or about 500° C. for a time period of about 15 minutes in a nitrogen ($N_2$) and hydrogen ($H_2$) ambient. Scanning electron microscope photographs showed that there was no significant agglomeration of the copper-aluminum alloy for substrates annealed at temperatures of about 380° C. or about 450° C. The copper-aluminum alloy showed some dewetting began to occur for substrates annealed at a temperature of about 500° C.

Example 4

Copper-aluminum alloy films comprising about 2.0 atomic percent of aluminum were deposited by physical vapor deposition utilizing a copper-aluminum target comprising aluminum in a concentration of about 2.0 atomic percent to either about a 50 Å or about a 100 Å thickness over an ALD TaN layer. The resulting substrates were annealed at a temperature of about 450° C. for a time period of about 30 minutes in an ambient of nitrogen ($N_2$) and hydrogen ($H_2$) ambient. Scanning electron microscope photographs showed that there was no significant agglomeration of the copper-aluminum alloy for substrates annealed at a temperature of about 450° C. for a time period of about 30 minutes.

While foregoing is directed to the preferred embodiment of the present invention, other and further embodiments of the invention may be devised without departing from the basic scope thereof, and the scope thereof is determined by the claims that follow.

The invention claimed is:

1. A system for processing a substrate, comprising:
   at least one atomic layer deposition chamber for depositing a barrier layer comprising tantalum, wherein the at least one atomic layer deposition chamber is in fluid communication with a first precursor source providing a tantalum-containing compound and a second precursor source; and
   at least one physical vapor deposition metal seed chamber for depositing a copper-containing seed layer on the barrier layer.

2. A system for processing a substrate, comprising:
   at least one atomic layer deposition chamber for depositing a barrier layer comprising tantalum, wherein the at least one atomic layer deposition chamber is in fluid communication with a first precursor source providing a tantalum-containing compound and a second precursor source; and
   at least one physical vapor deposition metal seed chamber for depositing a metal seed layer on the barrier layer.

3. The system of claim 2, wherein the metal seed layer comprises a metal selected from the group consisting of copper, titanium, zirconium, tin, alloys thereof, and combinations thereof.

4. The system of claim 3, wherein the at least one physical vapor deposition metal seed chamber is a high density plasma physical vapor deposition metal seed chamber.

5. The system of claim 4, further comprising one or more transfer chambers for transferring a substrate between the at least one atomic layer deposition chamber and the at least one physical vapor deposition metal seed chamber.

6. The system of claim 2, wherein the tantalum-containing compound is an organometallic tantalum precursor.

7. The system of claim 6, wherein the organometallic tantalum precursor is PDMAT.

8. The system of claim 7, wherein the PDMAT has a chlorine concentration of about 100 ppm or less.

9. The system of claim 8, wherein the chlorine concentration is about 30 ppm or less.

10. The system of claim 9, wherein the chlorine concentration is about 5 ppm or less.

11. The system of claim 2, wherein the second precursor source comprises a nitrogen precursor.

12. The system of claim 11, wherein the nitrogen precursor is ammonia.

13. The system of claim 2, wherein the tantalum-containing compound is a tantalum halide precursor.

14. The system of claim 13, wherein the tantalum halide precursor comprises chlorine.

15. A system for processing a substrate, comprising:
   at least one atomic layer deposition chamber for depositing a barrier layer comprising tantalum, wherein the at least one atomic layer deposition chamber is in fluid communication with a first precursor source providing a tantalum-containing compound and a second precursor source; and
   at least one deposition chamber is a physical vapor deposition chamber or an electroless deposition chamber for depositing a metal seed layer on the barrier layer.

16. The system of claim 15, wherein the metal seed layer comprises a metal selected from the group consisting of copper, titanium, zirconium, tin, alloys thereof, and combinations thereof.

17. The system of claim 16, wherein the at least one deposition chamber is a physical vapor deposition chamber.

18. The system of claim 17, wherein the physical vapor deposition chamber is a high density plasma physical vapor deposition metal seed chamber.

19. The system of claim 18, further comprising one or more transfer chambers for transferring a substrate between the at least one atomic layer deposition chamber and the physical vapor deposition chamber.

20. The system of claim 15, wherein the tantalum-containing compound is an organometallic tantalum precursor.

21. The system of claim 20, wherein the organometallic tantalum precursor is PDMAT.

22. The system of claim 21, wherein the PDMAT has a chlorine concentration of about 100 ppm or less.

23. The system of claim 22, wherein the chlorine concentration is about 30 ppm or less.

24. The system of claim 23, wherein the chlorine concentration is about 5 ppm or less.

25. The system of claim 15, wherein the second precursor source comprises a nitrogen precursor.

26. The system of claim 25, wherein the nitrogen precursor is ammonia.

27. The system of claim 15, wherein the tantalum-containing compound is a tantalum halide precursor.

28. The system of claim 27, wherein the tantalum halide precursor comprises chlorine.

* * * * *